`US008999817B2`

United States Patent
Tagami et al.

(10) Patent No.: US 8,999,817 B2
(45) Date of Patent: Apr. 7, 2015

(54) WAFER PROCESS BODY, WAFER PROCESSING MEMBER, WAFER PROCESSING TEMPORARY ADHESIVE MATERIAL, AND METHOD FOR MANUFACTURING THIN WAFER

(71) Applicant: Shin-Etsu Chemical Co., Ltd., Tokyo (JP)

(72) Inventors: Shohei Tagami, Annaka (JP); Michihiro Sugo, Takasaki (JP); Hiroyuki Yasuda, Tomioka (JP); Masahiro Furuya, Takasaki (JP); Hideto Kato, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/770,513

(22) Filed: Feb. 19, 2013

(65) Prior Publication Data

US 2013/0220687 A1    Aug. 29, 2013

(30) Foreign Application Priority Data

Apr. 27, 2012    (JP) ................................. 2012-102547

(51) Int. Cl.
*H01L 21/00*    (2006.01)
*C09J 7/00*    (2006.01)
(Continued)

(52) U.S. Cl.
CPC .................. *C09J 7/00* (2013.01); *H01L 21/304* (2013.01); *H01L 21/6835* (2013.01);
(Continued)

(58) Field of Classification Search
CPC .................................................. H01L 27/1266

USPC .......................................................... 438/464
See application file for complete search history.

(56) References Cited

U.S. PATENT DOCUMENTS 7,541,264 B2    6/2009    Gardner et al.
2004/0213994 A1    10/2004    Kozakai et al.
(Continued)

FOREIGN PATENT DOCUMENTS

EP    2 392 629 A1    12/2011
EP    2 551 322 A1    1/2013
(Continued)

OTHER PUBLICATIONS

May 10, 2013 European Search Report issued in European Application No. 13000966.5.
(Continued)

*Primary Examiner* — Yu-Hsi D Sun
(74) *Attorney, Agent, or Firm* — Oliff PLC

(57) ABSTRACT

Disclosed is a wafer process body, a temporary adhesive layer is formed on a supporting body, and a wafer having a circuit-formed front surface and a to-be-processed back surface is stacked on the temporary adhesive layer, wherein the temporary adhesive layer is provided with a first temporary adhesive layer including a non-aromatic saturated hydrocarbon group-containing organopolysiloxane layer (A) which is adhered to the front surface of the wafer so as to be detachable and a second temporary adhesive layer comprised of a thermosetting-modified siloxane polymer layer (B) which is stacked on the first temporary adhesive layer and adhered to the supporting body so as to be detachable. Thus, temporary adhesion of a wafer with a supporting body may become easy, process conformity with the TSV formation process and with the wafer-back surface-wiring process may become high, and removal may be done easily, with high productivity.

44 Claims, 1 Drawing Sheet

(51) Int. Cl.
  *H01L 21/304* (2006.01)
  *H01L 21/683* (2006.01)
  *C09J 7/02* (2006.01)

(52) U.S. Cl.
  CPC .... *C09J 7/0239* (2013.01); *H01L 2221/68327* (2013.01); *H01L 2221/6834* (2013.01); *H01L 2221/68381* (2013.01); *C09J 2201/122* (2013.01); *C09J 2201/36* (2013.01); *C09J 2203/326* (2013.01); *C09J 2483/00* (2013.01)

(56) References Cited

U.S. PATENT DOCUMENTS

2007/0090299 A1 4/2007 Kozakai et al.
2008/0090380 A1 4/2008 Gardner et al.
2009/0133812 A1 5/2009 Noda et al.
2012/0034437 A1* 2/2012 Puligadda et al. ............ 428/212

FOREIGN PATENT DOCUMENTS

| JP | A-2004-64040 | 2/2004 |
| JP | A-2006-328104 | 12/2006 |
| JP | A-2007-138149 | 6/2007 |
| JP | A-2008-532313 | 8/2008 |
| JP | A-2012-033737 | 2/2012 |

OTHER PUBLICATIONS

Apr. 15, 2014 Notification of Reasons for Refusal issued in Japanese Patent Application No. 2012-041499 (with partial English translation).

* cited by examiner

WAFER PROCESS BODY, WAFER PROCESSING MEMBER, WAFER PROCESSING TEMPORARY ADHESIVE MATERIAL, AND METHOD FOR MANUFACTURING THIN WAFER

BACKGROUND OF THE INVENTION

1. Field of the Invention

The present invention relates to a wafer process body, a wafer processing member, and a wafer processing temporary adhesive material, which is capable of giving a thin wafer effectively, respectively, and a method for manufacturing a thin wafer.

2. Description of the Related Art

A three-dimensional semiconductor mount becomes indispensable to realize higher density, larger capacity, higher processing speed, and lower power consumption than ever. According to the three-dimensional semiconductor mounting technology, a semiconductor chip is made thin, and then this is stacked in multilayer while connecting them by a silicon through electrode (TSV: through silicon via). To realize this, a process to make a substrate formed with a semiconductor circuit thin by grinding a surface not formed with a circuit (also referred to as the "back surface") and a process to form an electrode including TSV on the back surface thereafter are necessary.

In the process of grinding the back surface of the silicon substrate in the past, a protection tape is attached on the other side of the grinding surface to avoid wafer breakage during the time of grinding. However, because this tape uses an organic resin film as its base, strength and heat resistance thereof is insufficient though flexible; and thus, this is not suitable for the TSV forming process and for the process of forming a wiring layer on the back surface.

Accordingly, a proposal is made as to the system wherein a semiconductor substrate is bonded to a supporting body such as silicon and glass via an adhesive layer thereby making it withstand to the processes of back surface grinding and formation of a TSV and a back surface electrode. In this process, an adhesive layer to bond a substrate with a supporting body is important. It is necessary that this adhesive can bond the substrate with the supporting body coherently and has durability to withstand the subsequent processes, and in addition, the thin wafer needs to be readily removed from the supporting body at the end. Because removal is done at the end as mentioned above, this adhesive layer is called as a temporary adhesive layer in this specification.

Until now, following technologies in the public domain have been proposed as to the temporary adhesive layer and the removal method thereof, that is, a technology wherein a high energy beam is irradiated to an adhesive which contains a light-absorbing substance thereby decomposing the adhesive layer to effect removal of the adhesive layer from the supporting body (Patent Document 1) and a technology wherein a thermally meltable hydrocarbon compound is used in the adhesive thereby effecting adhesion and removal in the melting condition by heating (Patent Document 2). However, in the former technology, there have been such problems as: an expensive instrument such as a laser is necessary; a special substrate such as a glass substrate which can transmit a laser beam is necessary for the supporting body; and a treatment time per one substrate is long. In the latter technology, although control can be done easily only by heating, heat stability at high temperature above 200° C. is insufficient; and thus, its application range has been narrow. Moreover, these temporary adhesive layers have not been suitable for formation of a uniform film on a highly non-planar substrate or for coherent adhesion to the supporting body.

Alternatively, a technology in which a silicone agglutinant is used as the temporary adhesive layer is proposed (Patent Document 3). In this technology, a substrate is bonded to a supporting body by using an addition reaction-curable silicone agglutinant; and during the time of removal, the substrate is detached from the supporting body by soaking them in a chemical agent which can dissolve or decompose the silicone resin. This technology requires a very long time for removal; and thus, application to a practical manufacturing process is difficult.

CITATION LIST

Patent Literature

[Patent Document 1] Japanese Patent Laid-Open Publication No. 2004-64040
[Patent Document 2] Japanese Patent Laid-Open Publication No. 2006-328104
[Patent Document 3] U.S. Pat. No. 7,541,264

SUMMARY OF THE INVENTION

To solve the problems as mentioned above, following methods have been proposed: a method wherein a thermosetting resin layer and a thermoplastic resin layer are stacked as the temporary adhesive layer; and a method wherein a high molecular weight polymer of a non-aromatic saturated hydrocarbon group-containing organopolysiloxane is used as a monolayer as the temporary adhesive layer. However, in the former method, the thermoplastic resin is of a low elastic modulus and flowable at normal temperature, so that, depending on composition of the stacked substrate, there is a risk of causing deformation of the resin and fouling of an equipment during processing. In the latter method, it can be suitably used in the horizontal sliding method wherein heating is done for removal; but in the method wherein one surface of the stacked substrate is fixed horizontally while the other surface is pulled up with a certain angle from the horizontal direction, adhesion with the supporting body and the wafer is so strong and hard that removal is difficult; and thus, this poses a problem that its application to the actual manufacturing process is difficult.

The present invention was made in view of the situation as mentioned above and has an object to provide a wafer process body, a wafer processing member, a wafer processing temporary adhesive material, and a method for manufacturing a thin wafer by using this, so that temporary adhesion of a wafer with a supporting body may become easy, process conformity with the TSV formation process and with the wafer-back surface-wiring process may become high, and removal may be done easily, thereby having a high productivity.

The present invention was made in view of the situation as mentioned above and has an object to provide, a wafer process body, a wafer processing member, a wafer processing temporary adhesive material, and a method for manufacturing a thin wafer by using this, so that temporary adhesion of a wafer with a supporting body may become easy, process conformity with the TSV formation process and with the wafer-back surface-wiring process may become high, removal may be done easily, the supporting body may be reused after cleaning, and high productivity of a thin wafer may be obtained.

To solve the problems mentioned above, the present invention provides a wafer process body, wherein, in the wafer process body, a temporary adhesive layer is formed on a supporting body, and a wafer having a circuit-formed front surface and a to-be-processed back surface is stacked on the temporary adhesive layer, wherein the temporary adhesive layer comprises:

a first temporary adhesive layer composed of a non-aromatic saturated hydrocarbon group-containing organopolysiloxane layer (A) which is adhered to the front surface of the wafer so as to be detachable and a second temporary adhesive layer composed of a thermosetting-modified siloxane polymer layer (B) which is stacked on the first temporary adhesive layer and adhered to the supporting body so as to be detachable.

In addition, the present invention provides a wafer processing member, wherein, in the wafer processing member, a temporary adhesive layer is formed on a supporting body, and a wafer having a circuit-formed front surface and a to-be-processed back surface is to be temporarily adhered to the temporary adhesive layer, wherein the temporary adhesive layer comprises:

a second temporary adhesive layer composed of a thermosetting-modified siloxane polymer layer (B) which is adhered to the supporting body so as to be detachable and a first temporary adhesive layer composed of a non-aromatic saturated hydrocarbon group-containing organopolysiloxane layer (A) which is stacked on the second adhesive layer; the layer (A) being capable of adhesion to and detachment from the front surface of the wafer.

Further, the present invention provides a wafer processing temporary adhesive material, wherein the wafer processing temporary adhesive material is to temporarily bond a supporting body to a wafer which has a circuit formed front surface and a to-be-processed back surface, wherein the wafer processing temporary adhesive material has:

a first temporary adhesive layer composed of a non-aromatic saturated hydrocarbon group-containing organopolysiloxane layer (A) which is capable of adhesion to and detachment from the front surface of the wafer and a second temporary adhesive layer composed of a thermosetting-modified siloxane polymer layer (B) which is stacked on the first temporary adhesive layer; the layer (B) being capable of adhesion to and detachment from the supporting body.

When the wafer process body, the wafer processing member, and the wafer processing temporary adhesive material as mentioned above are used, temporary adhesion of the wafer with the supporting body is easy, a film having uniform film thickness can be formed on a highly non-planar substrate, process conformity with the TSV formation process and with the wafer-back surface-wiring process is high, and removal thereof can be done easily, so that a high productivity can be obtained.

To solve the problem mentioned above, the present invention provides a wafer process body, wherein in the wafer process body, a temporary adhesive layer is formed on a supporting body and a wafer having a circuit-formed front surface and a to-be-processed back surface is stacked on the temporary adhesive layer, wherein the temporary adhesive layer is a composite temporary adhesive layer having a three-layered structure comprised of:

a first temporary adhesive layer composed of a non-aromatic saturated hydrocarbon group-containing organopolysiloxane layer (A) which is adhered to the front surface of the wafer so as to be detachable, a second temporary adhesive layer composed of a thermosetting-modified siloxane polymer layer (B) which is stacked on the first temporary adhesive layer, and a third temporary adhesive layer composed of a non-aromatic saturated hydrocarbon group-containing organopolysiloxane layer (A') which is similar to the first temporary adhesive layer; the layer (A') being stacked on the second temporary adhesive layer and adhered to the supporting body so as to be detachable.

In addition, the present invention provides a wafer processing member, wherein, in the wafer processing member, a temporary adhesive layer is formed on a supporting body, and a wafer having a circuit-formed front surface and a to-be-processed back surface is to be temporarily adhered to the temporary adhesive layer, wherein the temporary adhesive layer comprises:

a third temporary adhesive layer composed of a non-aromatic saturated hydrocarbon group-containing organopolysiloxane layer (A') which is adhered to the supporting body so as to be detachable, a second temporary adhesive layer composed of a thermosetting-modified siloxane polymer layer (B) which is stacked on the third temporary adhesive layer, and a first temporary adhesive layer composed of a non-aromatic saturated hydrocarbon group-containing organopolysiloxane layer (A) which is similar to the third temporary adhesive layer and is stacked on the second adhesive layer; the layer (A) being capable of adhesion to and detachment from the front surface of the wafer.

Further, the present invention provides a wafer processing temporary adhesive material, wherein the wafer processing temporary adhesive material is to temporarily bond a supporting body to a wafer which has a circuit formed front surface and a to-be-processed back surface, wherein the wafer processing temporary adhesive material comprises:

a first temporary adhesive layer composed of a non-aromatic saturated hydrocarbon group-containing organopolysiloxane layer (A) which is capable of adhesion to and detachment from the front surface of the wafer, a second temporary adhesive layer composed of a thermosetting-modified siloxane polymer layer (B) which is stacked on the first temporary adhesive layer, and a third temporary adhesive layer composed of a non-aromatic saturated hydrocarbon group-containing organopolysiloxane layer (A') which is similar to the first temporary adhesive layer and is stacked on the second temporary adhesive layer; the layer (A') being capable of adhesion to and detachment from the supporting body.

When the wafer process body, the wafer processing member, and the wafer processing temporary adhesive material as mentioned above are used, temporary adhesion of the wafer with the supporting body is easy, a temporary adhesive layer having uniform film thickness can be formed even on a highly non-planar substrate, process conformity with the TSV formation process and with the wafer-back surface-wiring process is high, removal can be done easily, the supporting body can be reused after cleaning, and high productivity of a thin wafer can be obtained.

In this case, the foregoing non-aromatic saturated hydrocarbon group-containing organopolysiloxane layers (A) and (A') are preferably a non-aromatic saturated hydrocarbon group-containing organopolysiloxane layer which contains the units shown by the following formulae (I) to (III):

(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %, wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms; and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms.

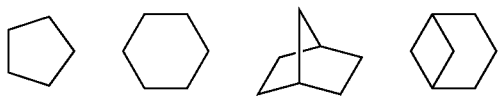

Accordingly, when the non-aromatic saturated hydrocarbon group-containing organopolysiloxane layers (A) and (A') are a layer formed from a non-aromatic saturated hydrocarbon group-containing organopolysiloxane which contains the units shown by the formulae (I) to (III), they show excellent adhesion and heat resistance. In addition, they are soluble in a non-polar organic solvent, so that the non-aromatic saturated hydrocarbon group-containing organopolysiloxane layer (A) which is remained on the circuit-formed surface of the wafer removed from the supporting body can be removed readily. On the other hand, it becomes the layer hardly soluble in a polar organic solvent which is used during the time of coating and removal of a photoresist on the semiconductor side (wafer side) of a bonding substrate (wafer process body); and thus, this is preferable.

Further in this case, the non-aromatic saturated hydrocarbon group-containing organopolysiloxane layers (A) and (A') are preferably an organopolysiloxane layer which is obtained by a hydrosilylation reaction between an alkenyl-containing organopolysiloxane (A1) which are a non-aromatic saturated hydrocarbon group-containing organopolysiloxanes which contain the units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms; and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms,

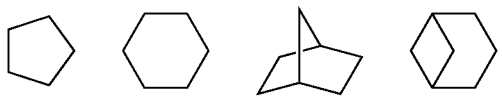

the alkenyl-containing organopolysiloxane (A1) containing 2 to 30 mol % of an alkenyl group having 2 to 7 carbon atoms relative to totality of the organic groups and hydrogen atoms shown by the foregoing $R^1$ to $R^6$, and a hydrosilyl-containing compound (A2) with the amount thereof being 0.4 to 1.0-fold of the SiH group relative to the total alkenyl group of the alkenyl-containing organopolysiloxane (A1), wherein the hydrosilyl-containing compound contains at least two SiH groups per one molecule and is shown by the following average composition formula (1), $$R^7_a R^8_b H_c SiO_{(4-a-b-c)/2} \qquad (1)$$

wherein $R^7$ represents a monovalent organic group other than an alkenyl group; $R^8$ represents a divalent organic group; and "a", "b", and "c" represent positive numbers which satisfy $0 < a \leq 2.5$, $0 \leq b \leq 1$, $0.75 \leq a+b \leq 2.5$, $0.005 \leq c \leq 1$, and $0.8 \leq a+b+c \leq 4$ in the presence of a platinum group metal-based catalyst.

The layer in which molecular weight of the organopolysiloxane is increased as mentioned above can give an organopolysiloxane layer not only being soluble in a non-polar organic solvent while hardly soluble in a polar organic solvent which is used during the time of coating and removal of a photoresist on the semiconductor side (wafer side) of a bonding substrate (wafer process body) but also being further excellent in adhesion property and heat resistance; and thus, this is preferable.

Further, the non-aromatic saturated hydrocarbon group-containing organopolysiloxane layers (A) and (A') are preferably an organopolysiloxane layer which is obtained by a hydrosilylation reaction between a hydrosilyl-containing organopolysiloxane (A3) which are a non-aromatic saturated hydrocarbon group-containing organopolysiloxanes which contain units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms; and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms,

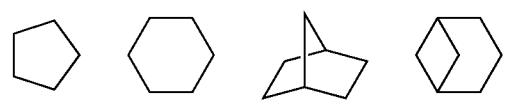

the hydrosilyl-containing organopolysiloxane (A3) containing 2 to 20 mol % of hydrogen atoms relative to totality of the organic groups and hydrogen atoms shown by the foregoing $R^1$ to $R^6$, and an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2), $$R^9_d R^{10}_e R^{11}_f SiO_{(4-d-e-f)/2} \qquad (2)$$

wherein $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy $0<d\leq 2$, $0\leq e\leq 1$, $0.75\leq d+e\leq 3$, $0.01\leq f\leq 1$, and $0.8\leq d+e+f\leq 4$ in the presence of a platinum group metal-based catalyst.

The layer in which molecular weight of the organopolysiloxane is increased as mentioned above can give an organopolysiloxane layer not only being soluble in a non-polar organic solvent while hardly soluble in a polar organic solvent which is used during the time of coating and removal of a photoresist on the semiconductor side (wafer side) of a bonding substrate (wafer process body) but also being further excellent in adhesion property and heat resistance; and thus, this is preferable.

Further in this case, the hydrosilyl-containing compound (A2) is preferably an organohydrogen polysiloxane which has SiH groups at the both terminals and is shown by the following structural formula (3) or a bissilyl compound which has the SiH groups at the both terminals and is shown by the following structural formula (4),

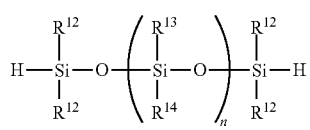
(3)

wherein "n" represents a positive number of 0 to 400; and $R^{12}$ to $R^{14}$ represent the same or different substituted or unsubstituted monovalent organic group,

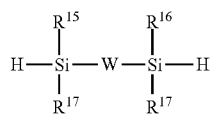
(4)

wherein $R^{15}$ to $R^{17}$ represent the same or different substituted or unsubstituted monovalent organic group; and W represents a divalent organic group.

The hydrosilyl-containing compound (A2) like this can readily undergo a hydrosilylation reaction with the alkenyl group of the alkenyl-containing organopolysiloxane (A1) and can also give a hydrosilyl-containing compound (A2) which has good compatibility with the alkenyl-containing organopolysiloxane (A1); and thus, this is preferable from the viewpoint of a hydrosilylation reaction.

Further, it is preferable that the afore-mentioned thermosetting-modified siloxane polymer layer (B) be a cured layer of a composition containing 0.1 to 50 parts by mass of one or more kinds of crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule, relative to 100 parts by mass of a thermosetting-modified siloxane polymer composed of a silphenylene-containing polymer having a repeating unit shown by the following general formula (5) with the weight-average molecular weight of 3,000 to 500,000 or an epoxy group-containing silicone polymer having a repeating unit shown by the following general formula (6) with the weight-average molecular weight of 3,000 to 500,000.

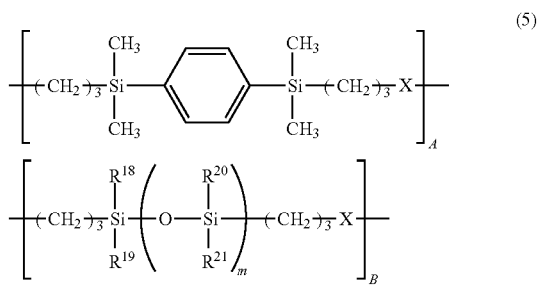
(5)

[In the formula, $R^{18}$ to $R^{21}$ represent the same or different monovalent hydrocarbon group having 1 to 8 carbon atoms; "m" represents an integer of 1 to 100; A represents a positive number and B represents 0 or a positive number; and X represents a divalent organic group shown by the following general formula (7).

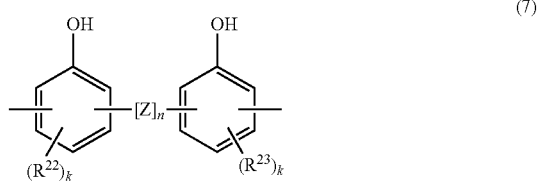
(7)

(In the formula, Z represents a divalent organic group selected from any of

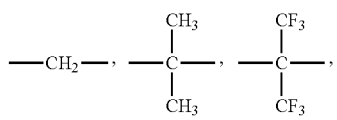

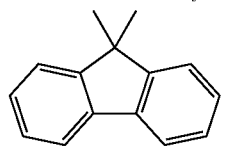

wherein, "n" represents 0 or 1; each of $R^{22}$ and $R^{23}$ represents the same or different alkyl or alkoxy group having 1 to 4 carbon atoms; and "k" represents any of 0, 1, and 2).]

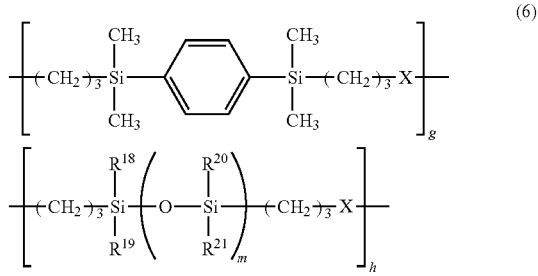
(6)

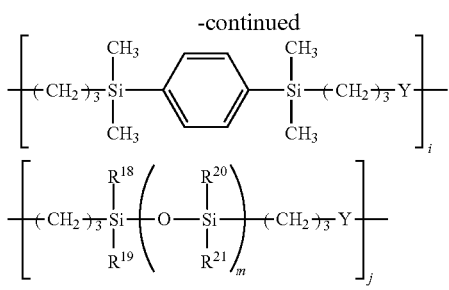

[In the formula, $R^{18}$ to $R^{21}$ represent the same or different monovalent hydrocarbon group having 1 to 8 carbon atoms; "m" represents an integer of 1 to 100; "g", "h", "i", and "j" represent 0 or a positive number which satisfies $0<(i+j)/(g+h+i+j)\leq 1.0$, and "i" and "j" are not 0 at the same time; X represents a divalent organic group shown by the following general formula (7); and Y represents a divalent organic group shown by the following general formula (8).

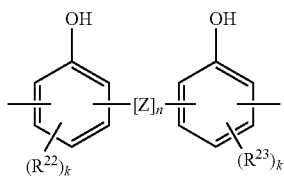 (7)

(In the formula, Z represents a divalent organic group selected from any of

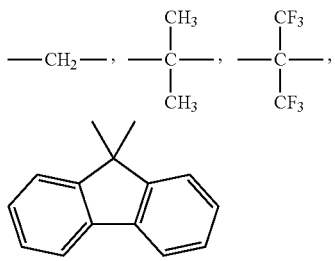

wherein, "n" represents 0 or 1; each of $R^{22}$ and $R^{23}$ represents the same or different alkyl or alkoxy group having 1 to 4 carbon atoms; and "k" represents any of 0, 1, and 2,

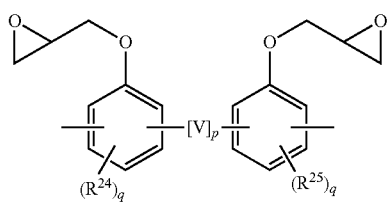 (8)

wherein V represents a divalent organic group selected from any of

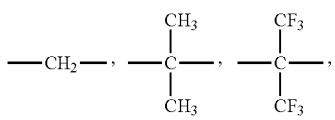

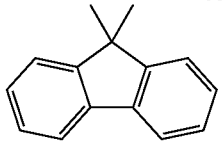

wherein, "p" represents 0 or 1; each of $R^{24}$ and $R^{25}$ represents the same or different alkyl or alkoxy group having 1 to 4 carbon atoms; and "q" represents any of 0, 1, and 2.

The polymer layer (B) as mentioned above becomes further excellent in heat resistance and gives a temporary adhesive layer having better uniformity in film thickness; and thus, this is preferable.

In addition, the present invention provides a method for manufacturing a thin wafer comprising:
(a) a step of grinding or polishing of the non-circuit-formed surface of the wafer in the wafer process body,
(b) a step of processing of the non-circuit-formed surface of the wafer, and
(c) a step of detaching the processed wafer from the supporting body.

With the method for manufacturing of a thin wafer as mentioned above, a thin wafer having a through electrode structure or a bump connecting structure can be readily manufactured by using the temporary adhesive layer formed of two layers in the present invention to bond a wafer with a supporting body.

With the method for manufacturing of a thin wafer as mentioned above, a thin wafer having a through electrode structure or a bump connection structure can be readily manufactured by using the temporary adhesive layer formed of three layers in the present invention to bond a wafer with a supporting body.

In this case, detachment of the processed wafer from the supporting body in the step (c) is preferably done by a method wherein, after a dicing tape is adhered on the processed surface of the processed wafer, surface of the dicing tape is vacuum-adhered onto a suction surface, and then, the supporting body is detached by peeling-off from the processed wafer with the temperature of the suction surface being in the range of 10 to 100° C.

According to the detachment process as mentioned above, the supporting body can be readily detached from the processed body, and in addition, the dicing process thereafter can be done readily.

Further in this case, after detachment of the processed wafer from the supporting body in the step (c), it is preferable to carry out (d) a step of removing the non-aromatic saturated hydrocarbon group-containing organopolysiloxane layer (A) which is remained on the circuit-formed surface of the detached wafer.

On the circuit-formed surface of the wafer which is detached from the supporting body in the step (c), a part of the non-aromatic saturated hydrocarbon group-containing organopolysiloxane layer (A) remains occasionally. Removal of this non-aromatic saturated hydrocarbon group-containing organopolysiloxane layer (A) may be done, for example, by cleaning the wafer by a non-polar organic solvent.

The temporary adhesive layer of the present invention has high heat resistance; and thus, it can be applied to wide range of the semiconductor film formation processes; an adhesive layer having uniform film thickness can be formed even on a non-planar wafer; a thin wafer having uniform thickness of 50 µm or less can be readily obtained because of this uniform film thickness; and in addition, after manufacturing of the thin wafer, this wafer can be readily detached from the supporting body at room temperature, so that a thin wafer which is easily breakable can be manufactured readily.

DESCRIPTION OF THE EMBODIMENTS

Inventors of the present invention carried out an extensive investigation to achieve the objects mentioned above; and as a result, they found a method to manufacture a thin wafer having a through electrode structure or a bump connecting structure could be manufactured readily by using a temporary adhesive layer composed of two layers to bond a wafer with a supporting body, wherein the two layers comprise:
a non-aromatic saturated hydrocarbon group-containing organopolysiloxane layer (A) (first temporary adhesive layer) and
a thermosetting-modified siloxane polymer layer (B) (second temporary adhesive layer).

Figure 1:
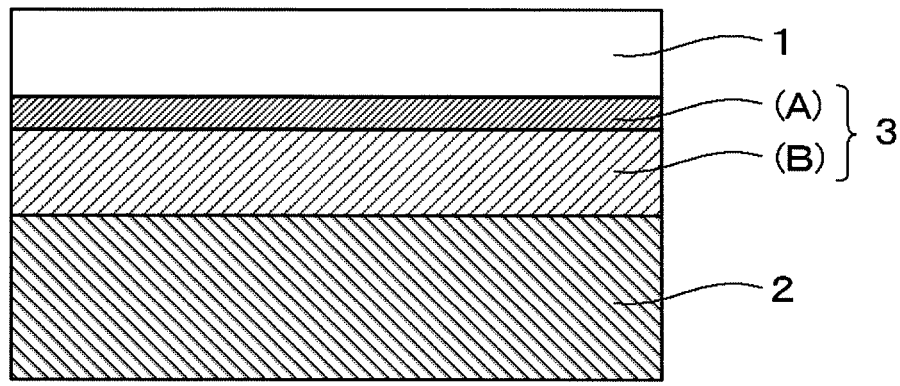
FIG. 1 is a cross section view of one example of the wafer process body in the present invention.

As shown in FIG. 1, the wafer process body 10 of the present invention comprises the wafer to be processed 1, the supporting body 2 to support the wafer 1 during processing of the wafer 1, and the temporary adhesive layer 3 which intervenes the wafer 1 and the supporting body 2, wherein this temporary adhesive layer 3 comprises the non-aromatic saturated hydrocarbon group-containing organopolysiloxane layer (A) (first temporary adhesive layer) and the thermosetting-modified siloxane polymer layer (B) (second temporary adhesive layer), wherein the first temporary layer is adhered to the front surface of the wafer having a circuit-formed front surface and a to-be-processed back surface so as to be detachable and the second temporary adhesive layer is adhered to the supporting body so as to be detachable.

Further, the wafer processing member of the present invention comprises the supporting body 2, the thermosetting-modified siloxane polymer layer (B) which is stacked thereon, and the non-aromatic saturated hydrocarbon group-containing organopolysiloxane layer (A) which is stacked on the layer (B); and, the wafer processing temporary adhesive material of the present invention is layered product composed of the foregoing layers (A) and (B).

Inventors of the present invention carried out an extensive invention to achieve the objects mentioned above, and as a result, they found a method to manufacture a thin wafer having a through electrode structure or a bump connecting structure could be manufactured readily by using a temporary adhesive layer composed of three layers to bond a wafer with a supporting body, wherein the three layers comprise:
a thermoplastic temporary adhesive layer (A) comprised of a non-aromatic saturated hydrocarbon group-containing organopolysiloxane,
a thermosetting temporary adhesive layer (B) mainly comprised of a modified siloxane polymer, and
a thermoplastic temporary adhesive layer (A') comprised of a non-aromatic saturated hydrocarbon group-containing organopolysiloxane, which is similar to the foregoing (A).

Figure 2:
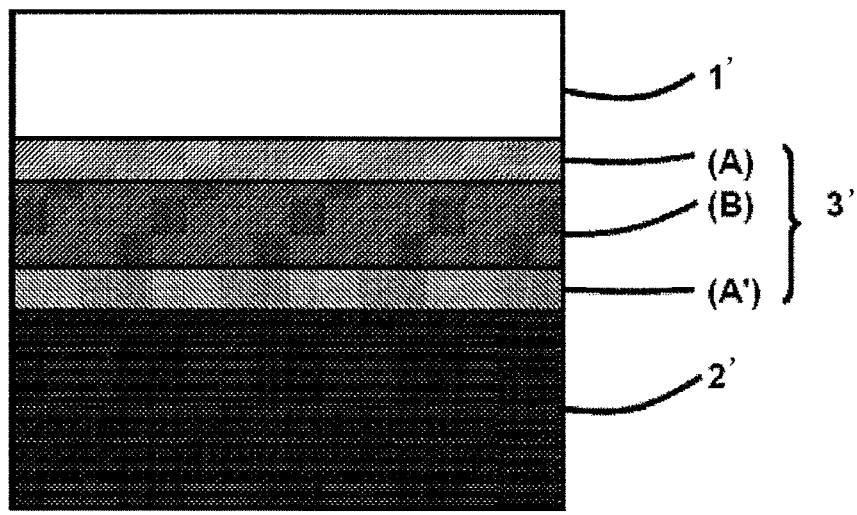
FIG. 2 is a cross section view of one example of the wafer process body in the present invention.

As shown in FIG. 2, the wafer process body 10' of the present invention comprises the wafer to be processed 1', the supporting body 2' to support the wafer 1' during processing of the wafer 1', and the temporary adhesive layer 3' which intervenes the wafer 1' and the supporting body 2', wherein this temporary adhesive layer 3' comprises three layers of the non-aromatic saturated hydrocarbon group-containing organopolysiloxane layer (A) (first temporary adhesive layer), the thermosetting-modified siloxane polymer layer (B) (second temporary adhesive layer), and further the non-aromatic saturated hydrocarbon group-containing organopolysiloxane layer (A') (third temporary adhesive layer), which is similar to the first temporary adhesive layer, wherein the first temporary layer is adhered to surface of the wafer 1' having a circuit-formed front surface and a to-be-processed back surface so as to be detachable and the third temporary adhesive layer is adhered to the supporting body 2' so as to be detachable.

Further, the wafer processing member of the present invention has the supporting body 2', the non-aromatic saturated hydrocarbon group-containing organopolysiloxane layer (A') which is stacked thereon, the thermosetting-modified siloxane polymer layer (B) which is stacked on the layer (A'), and the non-aromatic saturated hydrocarbon group-containing organopolysiloxane layer (A) which is stacked on the layer (B); and, the wafer processing temporary adhesive material of the present invention is a layered product composed of the foregoing layers ((A), (B), and (A')).

Hereinafter, the present invention will be explained in more detail.

1. Temporary Adhesive Layer 1.1 First Temporary Adhesive Layer (A) and Third Temporary Adhesive Layer (A'): Non-Aromatic Saturated Hydrocarbon Group-Containing Organopolysiloxane Layer The non-aromatic saturated hydrocarbon group-containing organopolysiloxane which is used in the first adhesive layer (A) and the third adhesive layer (A') may be the same or different. As the non-aromatic saturated hydrocarbon group-containing organopolysiloxane, the non-aromatic saturated hydrocarbon group-containing organopolysiloxane containing the units shown by the following (I) to (III) can be exemplified:
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %.
(In the above formulae, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms; and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms).

The foregoing $R^1$ to $R^6$ represent a monovalent organic group or a hydrogen atom. In addition, 50 mol % or more, or preferably 60 mol % or more, of entirety of the organic groups and the hydrogen atoms shown by $R^1$ to $R^6$ is a non-aromatic saturated hydrocarbon group having 3 to 20 carbon atoms; and 40 mol % or more, preferably 50 mol % or more, or more preferably 60 mol % or more, of entirety of the organic groups and the hydrogen atoms shown by $R^1$ to $R^3$ is the same or different non-aromatic saturated hydrocarbon group which contains the above cyclic structures having 5 to 7 carbon atoms. Moreover, the group other than a non-aromatic saturated hydrocarbon group in the entirety of the organic groups and the hydrogen atoms shown by $R^1$ to $R^6$ is a hydrogen atom or the same or different substituted or unsubstituted monovalent hydrocarbon group having 1 to 7 carbon atoms.

The organopolysiloxane as mentioned above has a non-aromatic unsaturated hydrocarbon group as an organic group; and because of this, it is hardly soluble in a polar organic solvent which is used during the time of coating and removal of a photoresist on the semiconductor side of a bonding substrate while it is soluble in a non-polar organic solvent. That is, when 50 mol % or more of entirety of the organic groups and hydrogen atoms shown by $R^1$ to $R^6$ in the units of T, D, and M is a non-aromatic saturated hydrocarbon group having 3 to 20 carbon atoms, the organopolysiloxane which is hardly soluble in a polar organic solvent mentioned above and soluble in a non-polar hydrocarbon solvent such as hexane, octane, and isododecane and which is excellent in heat resistance can be obtained. In addition, when content of the non-aromatic saturated hydrocarbon groups, especially the non-aromatic saturated hydrocarbon group which contains the above cyclic structures having 5 to 7 carbon atoms, is increased, the organopolysiloxane having further excellent heat resistance can be obtained.

Specific example of the non-aromatic saturated hydrocarbon group includes a n-propyl group, an isopropyl group, a n-butyl group, an isobutyl group, a t-butyl group, a n-pentyl group, a cyclopentyl group, a n-hexyl group, a cyclohexyl group, an octyl group, a n-decyl group, a n-dodecyl group, a norbornyl group, a norbornylethyl group, and an adamantyl group, though a n-propyl group, a n-hexyl group, a cyclopentyl group, a cyclohexyl group, and a norbornyl group are preferable. Especially, to have high heat resistance, the content of the cyclic hydrocarbon group (non-aromatic saturated hydrocarbon group having a cyclic structure) is important. When the content of the cyclic hydrocarbon group as the non-aromatic saturated hydrocarbon group is 40 mol % or more relative to entirety of the organic groups and the hydrogen atoms shown by $R^1$ to $R^3$, the organopolysiloxane having excellent durability at high temperature of 260° C. or higher with further excellent heat resistance can be obtained. Among these cyclic hydrocarbon groups, structures which contain a cyclopentyl skeleton, a cyclohexyl skeleton, a bicyclo[2.2.1] skeleton, and bicyclo[3.1.1] skeleton, which are monovalent and/or divalent and which are shown below, are preferable.

The foregoing non-aromatic saturated hydrocarbon group-containing organopolysiloxane contains 40 to 99 mol % of (I) the siloxane unit shown by $R^1SiO_{3/2}$ (T Unit), 59 mol % or less of (II) the siloxane unit shown by $R^2R^3SiO_{2/2}$ (D Unit), and 1 to 30 mol % of (III) the siloxane unit shown by $R^4R^5R^6SiO_{1/2}$ (M Unit). The organopolysiloxane having the above structure can be prepared by carrying out a hydrolysis reaction and a condensation reaction of hydrolysable raw material silanes with controlling these reactions. Meanwhile, the foregoing non-aromatic saturated hydrocarbon group-containing organopolysiloxane is preferably in a solid state at temperature of 40° C. or less in consideration of handling thereof.

Specific example of the hydrolysable silane which can be used as the raw materials includes methyl trichloro silane, phenyl trichloro silane, n-propyl trichloro silane, isopropyl trichloro silane, n-butyl trichloro silane, isobutyl trichloro silane, n-pentyl trichloro silane, isopentyl trichloro silane, cyclopentyl trichloro silane, n-hexyl trichloro silane, cyclohexyl trichloro silane, n-octyl trichloro silane, n-decyl trichloro silane, n-dodecyl trichloro silane, bicyclo[2.2.1] heptyl trichloro silane (C1), bicyclo[2.2.1]nonyl trichloro silane (C2), bicyclo[3.1.1]decyl trichloro silane (C3 and C4), dimethyl dichloro silane, n-propyl methyl dichloro silane, isopropyl methyl dichloro silane, n-butyl methyl dichloro silane, isobutyl methyl dichloro silane, n-hexyl methyl dichloro silane, cyclohexyl methyl dichloro silane, and diphenyl dichloro silane; and further examples thereof include the above compounds having a methoxy group and an ethoxy group as the hydrolysable group.

Especially, those compounds shown by the following (C1) to (C4) having a plurality of cyclic structures have stereoisomers of an endo body and an exo body; and they can be used regardless of these isomers.

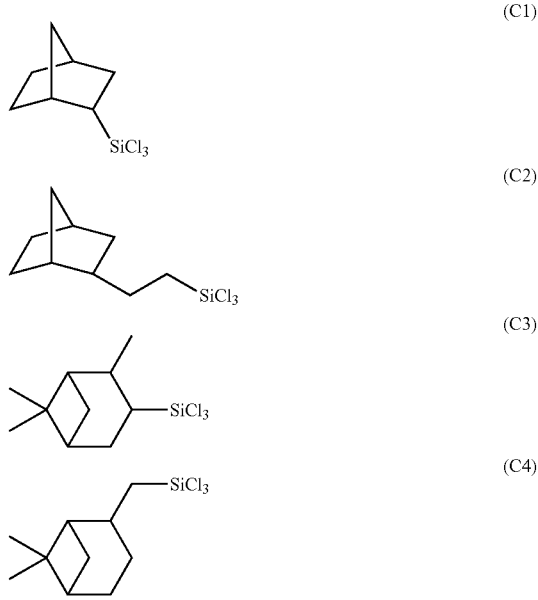

When the non-aromatic saturated hydrocarbon group-containing organopolysiloxane in the present invention contains 40 to 99 mol % of the T Unit, the organopolysiloxane tends to be a solid state at 40° C. or lower. In addition, the organopolysiloxane is soluble in a non-polar organic solvent and hardly soluble in a polar organic solvent which is used during the time of coating and removal of a photoresist on the semiconductor side of a bonding substrate. In addition, in view of the heat stability mentioned later, it is preferable that the non-aromatic saturated hydrocarbon group-containing organopolysiloxane of the present invention do not remain reactive terminal groups, i.e., a silanol and a hydrolysable residue. Accordingly, a structure having the M Unit introduced to the terminal thereof is preferable, wherein the content of the M Unit is preferably 1 mol % or more.

When the non-aromatic saturated hydrocarbon group-containing organopolysiloxane in the present invention contains 59 mol % or less of the D Unit, the organopolysiloxane tends to be a solid state at 40° C. or lower. In addition, when this is used for a temporary adhesive composition, the wafer can be boded to the supporting substrate sufficiently well. In other words, because there is no fear of becoming to a liquid or a flowable viscous substance, bonding of the supporting substrate to the wafer which has a semiconductor circuit may become sufficiently well, whereby eliminating a risk to cause a trouble such as misalignment of the stacked wafer during the time of back surface polishing or subsequent processing; and thus, this is preferable.

When the non-aromatic saturated hydrocarbon group-containing organopolysiloxane of the present invention contains 1 to 30 mol % of the M Unit, the organopolysiloxane becomes hardly soluble in a polar organic solvent which is used during the time of coating and removal of a photoresist on the semiconductor side of a bonding substrate, whereby giving a structure having a reactive terminal group such as a silanol and a hydrolysable residue reduced sufficiently well. In addition, when the content is 30 mol % or less, there is no risk of increase in the terminal group thereby relatively decreasing the molecular weight; and thus, this is preferable.

If there is a molecular terminal group which is not blocked by the M Unit, namely, if a hydrolysable residue such as a silanol group and an alkoxysilyl group is present, the content of these reactive terminal groups is preferably as small as possible. When the content of the terminal residue of a silanol group or an alkoxysilyl group in a molecule is small, a significant change in substrate removability by a crosslinking due to a thermal condensation reaction can be suppressed; and thus, this is preferable. Here, total amount of the silanol OH group and the alkoxysilyl OR group (Si—OR: R represents an alkoxy residue of an alkoxysilane which is used as a raw material, such as, a methoxy group, an ethoxy group, a n-propoxy group, and an isopropoxy group) is preferably 5% or less by mass, or more preferably 3% or less by mass, relative to total solid amount in the resin. By introduction of the M Unit, amount of the reactive terminal groups like this can be reduced to an intended level.

Molecular weight distribution of the non-aromatic saturated hydrocarbon group-containing organopolysiloxane of the present invention is important. Accordingly, the weight-average molecular weight which is obtained by a calibration curve with a polystyrene standard as measured by GPC (gel permeation chromatography) is preferably 2,000 or more. The non-aromatic saturated hydrocarbon group-containing organopolysiloxane which has weight-average molecular weight of 2,000 or more is preferable because it has excellent heat resistance. More preferable range of the weight-average molecular weight of the non-aromatic saturated hydrocarbon group-containing organopolysiloxane is about 3,000 to 200,000, or still more preferably about 5,000 to 150,000.

As to the GPC instrument which can analyze this, HLC-8120GPC, HLC-8220GPC, and HLC-8230GPC, which are manufactured by Tosoh Corporation, may be used.

The non-aromatic saturated hydrocarbon group-containing organopolysiloxane as mentioned above can be obtained by a heretofore known method. For example, any one of an organochloro silane and an organoalkoxy silane or both, which can produce the siloxane units (T, D, and M Units) by a hydrolysis condensation reaction, or their partial hydrolysis condensates, may be used. The organopolysiloxane can be obtained, for example, by mixing excessive water to hydrolyze all of hydrolysable groups (a chloro group, an alkoxy group, and so on) and an organic solvent, which is capable of dissolving the raw material silane compounds and a produced organopolysiloxane, with a mixture solution of raw material silane compounds thereby effecting an hydrolysis condensation reaction of them. The organopolysiloxane having an intended weight-average molecular weight can be obtained by controlling reaction temperature, reaction time, and blending amounts of water and an organic solvent. The organopolysiloxane thus obtained may be used as a temporary adhesive, for example, after it is once made to a solid state by removing an unnecessary organic solvent component.

Alternatively, the first temporary adhesive layer (A) and the third temporary adhesive layer (A') in the present invention may be the layer of the organopolysiloxane whose molecular weight is increased by using the foregoing non-aromatic saturated hydrocarbon group-containing organopolysiloxane as a raw material. Hereinafter, the organopolysiloxane whose molecular weight is increased like this will be explained.

As to the organopolysiloxane whose molecular weight is increased like this, the organopolysiloxane whose molecular weight is increased by a hydrosilylation reaction between an alkenyl-containing organopolysiloxane (A1) which are a non-aromatic saturated hydrocarbon group-containing organopolysiloxanes which contain the units shown by the following formulae (I) to (III):

(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %, (in the above formulae, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms; and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms),

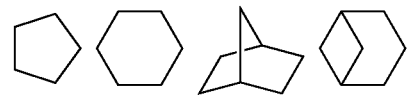

the alkenyl-containing organopolysiloxane (A1) containing 2 to 30 mol % of an alkenyl group having 2 to 7 carbon atoms relative to totality of the organic groups and hydrogen atoms shown by the foregoing $R^1$ to $R^6$, and
a hydrosilyl-containing compound (A2) with the amount thereof being 0.4 to 1.0-fold of the total SiH group relative to the total alkenyl group of the alkenyl-containing organopolysiloxane (A1), wherein the hydrosilyl-containing compound contains at least two SiH groups per one molecule and is shown by the following average composition formula (1)

$$R^7_a R^8_b H_c SiO_{(4-a-b-c)/2} \qquad (1)$$

(in the formula (1), $R^7$ represents a monovalent organic group other than an alkenyl group; $R^8$ represents a divalent organic group; and "a", "b", and "c" represent positive numbers which satisfy 0<a≤2.5, 0≤b≤1, 0.75≤a+b≤2.5, 0.005≤c≤1, and 0.8≤a+b+c≤4)
in the presence of a platinum group metal-based catalyst may be mentioned.

In this case, the content of the alkenyl group is 2 to 30 mol % relative to totality of the organic groups and the hydrogen atoms shown by at least $R^1$ to $R^6$. When the content of the alkenyl group is 2 mol % or more, increase of the molecular weight by the hydrosilylation reaction is so large that the organopolysiloxane having excellent physical properties including heat resistance may be obtained; and thus, this is preferable. When the content thereof is 30 mol % or less, solubility thereof in a polar organic solvent which is used during the time of coating and removal of a photoresist on the semiconductor side of a bonding substrate becomes further lower; and thus, this is preferable.

Illustrative example of the alkenyl group like this includes a vinyl group, an allyl group, a butenyl group, a hexenyl group, a cyclohexenyl group, and a norbornenyl group, while a vinyl group is preferable in view of its reactivity.

The foregoing $R^7$ in the average composition formula (1) represents a monovalent organic group except for an alkenyl group; and the foregoing $R^8$ represents a divalent organic group. $R^7$ is not particularly restricted provided that it is a monovalent organic group except for an alkenyl group, wherein illustrative examples thereof are a methyl group, a n-propyl group, an isopropyl group, a hexyl group, a cyclohexyl group, and a phenyl group. $R^8$ is not particularly restricted provided that it is a divalent organic group, wherein illustrative examples thereof are a methylene group, an ethylene group, a butanylene group, a hexylene group, a cyclohexylene group, and a phenylene group.

In the average composition formula (1), "a" and "b" show content of the organic groups in a molecule, and "a", "b", and "c" represent positive numbers which satisfy 0<a≤2.5, 0≤b≤1, 0.75≤a+b≤2.5, 0.005≤c≤1, and 0.8≤a+b+c≤4. When a+b is less than 0.75, the value "c", i.e., content of the SiH group, increases relatively. In considering the hydrosilylation reaction of the alkenyl group in the alkenyl-containing organopolysiloxane (A1) with the SiH group in the hydrosilyl-containing compound (A2), large content of the SiH group leads to high crosslinking degree, so that there is a tendency that organosiloxane whose molecular weight is increased undergoes gelation. In addition, when large amount of the SiH group remains, possibility to generate a gas by thermal degradation becomes high. If a+b is 2.5 or less, amount of the SiH group is appropriate, so that the reaction to give a higher molecular weight takes place properly. When "a" is 2.5 or less, amount of the SiH group which involves in the crosslinking reaction is appropriate thereby increasing the molecular weight thereof to the intended value, resulting in excellent heat resistance. Accordingly, "a", "b", and "c" are preferably in the above-mentioned range. In addition, the value "c" is preferably 1.0 or less in view of availability of the silicon raw material, and is preferably 0.005 or more in order to facilitate the crosslinking reaction sufficiently well.

In addition, total amount of the SiH group in the component (A2) is preferably 0.4 to 1.0 relative to total amount of the alkenyl group in the component (A1). When the ratio is 0.4 or more, increase of the molecular weight is sufficient, and intended heat resistance and adhesion property can be obtained. When the ratio is 1.0 or less, crosslinking of the resin is appropriate thereby leading to suppression of gelation, to decrease in amount of the remaining SiH group in the resin, and to suppression in foaming during the time of the test for heat resistance after bonding; and thus, this range is preferable.

More specific examples of the usable hydrosilyl-containing compound (A2) are a linear polysiloxane, polysilyl alkylene, and polysilyl arylene, which have SiH groups at the both terminals. Especially, an organohydrogen polysiloxane which has the SiH groups at the both terminals and is shown by the following structural formula (3) or a bissilyl compound which has the SiH groups at the both terminals and is shown by the following structural formula (4) is preferable,

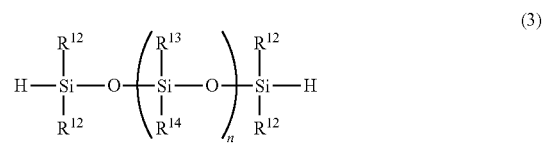

(3)

wherein "n" represents a positive number of 0 to 400; and $R^{12}$ to $R^{14}$ represent the same or different substituted or unsubstituted monovalent organic group.

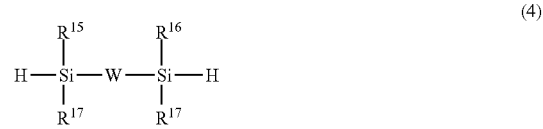

(4)

(In the formula, $R^{15}$ to $R^{17}$ represent the same or different substituted or unsubstituted monovalent organic group; and W represents a divalent organic group.)

The foregoing $R^{12}$ to $R^{17}$ represent the same or different substituted or unsubstituted monovalent organic group. $R^{12}$ to $R^{17}$ are not particularly restricted, and illustrative examples thereof are monovalent hydrocarbon groups having 1 to 8 carbon atoms; and specific examples thereof are a methyl group, a propyl group, a hexyl group, a cyclohexyl group, and a phenyl group. Especially preferable examples thereof are a methyl group, a cyclohexyl group, and a phenyl group.

The degree of polymerization "n" of the organohydrogen polysiloxane shown by the above structural formula (3) is 0 to 400. The polysiloxane having a large degree of polymerization "n" with 200 or more in this range of "n" is sluggish in the hydrosilylation reaction with the alkenyl group of (A1); and thus, in this case, it is preferable to concurrently use the siloxane having degree of polymerization "n" in the range of 0 to 40. Meanwhile, "n" is preferably 200 or less, because compatibility of the organohydrogen polysiloxane with the alkenyl-containing organopolysiloxane (A1) is good enough and the reactivity of the terminal SiH group is not decreased in this range.

The connecting group W of the bissilyl compound shown by the above structural formula (4) is a divalent organic group. W is not particularly restricted, while illustrative examples thereof are a divalent hydrocarbon group having 1 to 10 carbon atoms and a phenylene group. Especially in view of heat resistance of the organopolysiloxane whose molecular weight is increased, a phenylene group is preferable.

When the organopolysiloxane whose molecular weight is increased as mentioned above is used, the organopolysiloxane is not only soluble in a non-polar organic solvent while hardly soluble in a polar organic solvent which is used during the time of coating and removal of a photoresist on the semiconductor side of the bonding substrate but also further excellent in adhesion property and heat resistance.

Further, the first temporary adhesive layer (A) and the third temporary adhesive layer (A') of the present invention may be not only a product of the addition reaction of the alkenyl-containing organopolysiloxane (A1) with the hydrosilyl-containing compound (A2) but also an organopolysiloxane layer whose molecular weight is increased by an addition reaction of a hydrosilyl-containing organopolysiloxane (A3) with an alkenyl-containing compound (A4) (namely this is a combination of the compounds whose reactive groups are exchanged in the above-mentioned combination).

As to the organopolysiloxane like this, the organopolysiloxane whose molecular weight is increased by a hydrosilylation reaction between a hydrosilyl-containing organopolysiloxane (A3) which are a non-aromatic saturated hydrocarbon group-containing organopolysiloxanes which contain the units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
(in the above formulae, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms; and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms),

the hydrosilyl-containing organopolysiloxane (A3) containing 2 to 20 mol % of hydrogen atoms relative to totality of the organic groups and hydrogen atoms shown by the foregoing $R^1$ to $R^6$, and
an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2)

(in the formula (2), $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy $0<d\leq2$, $0\leq e\leq1$, $0.75\leq d+e\leq3$, $0.0\leq f\leq1$, and $0.8\leq d+e+f\leq4$)
in the presence of a platinum group metal-based catalyst may be mentioned.

In this case, the content of the hydrogen atoms is 2 to 20 mol % relative to totality of the organic groups and the hydrogen atoms shown by at least $R^1$ to $R^6$. When the content of the hydrogen atoms is 2 mol % or more, increase of the molecular weight by the hydrosilylation reaction is so large that the organopolysiloxane having excellent physical properties including heat resistance may be obtained; and thus, this is preferable. When the content thereof is 20 mol % or less, solubility thereof in a polar organic solvent which is used during the time of coating and removal of a photoresist on the semiconductor side of the bonding substrate becomes further lower; and thus, this is preferable.

$R^9$ in the average composition formula (2) represents a monovalent organic group except for an alkenyl group; and $R^{10}$ represents a divalent organic group. $R^{11}$ represents an alkenyl group having 2 to 6 carbon atoms. Here, $R^9$ is not particularly restricted provided that it is a monovalent organic group except for an alkenyl group, wherein illustrative examples thereof are a methyl group, a n-propyl group, an isopropyl group, a hexyl group, a cyclohexyl group, and a phenyl group. Similarly, $R^{10}$ is not particularly restricted provided that it is a divalent organic group, wherein illustrative examples thereof are a methylene group, an ethylene group, a butanylene group, a hexylene group, a cyclohexylene group, and a phenylene group. $R^{11}$ represents an alkenyl group having 2 to 6 carbon atoms and is not particularly restricted; and illustrative example thereof are a vinyl group, an allyl group, a butenyl group, a hexenyl group, a cyclohexenyl group, and a norbornenyl group, while a vinyl group is preferable in view of its reactivity.

In the average composition formula (2), "d", "e", and "f" show the content of the organic groups in a molecule, and "d", "e", and "f" represent positive numbers which satisfy $0<d\leq2$, $0\leq e\leq1$, $0.75\leq d+e\leq3$, $0.01\leq f\leq1$, and $0.8\leq d+e+f\leq4$.

In addition, total amount of the alkenyl group in the component (A4) is 1.0 to 2.5 relative to total amount of the SiH group in the component (A3). When the ratio is 1.0 or more, increase of the molecular weight is sufficient, and intended heat resistance and adhesion property can be obtained. When the ratio is 2.5 or less, crosslinking of the resin is appropriate thereby leading to suppression of gelation, to decrease in amount of the remaining SiH group in the resin, and to suppression in foaming during the time of the test for heat resistance after bonding; and thus, this range is preferable.

An organopolysiloxane whose molecular weight is increased as mentioned above can give an organopolysiloxane not only being soluble in a non-polar organic solvent while hardly soluble in a polar organic solvent which is used during the time of coating and removal of a photoresist on the semiconductor side of the bonding substrate but also being further excellent in adhesion property and heat resistance.

The organopolysiloxane whose molecular weight is increased can be obtained by the reaction between the alkenyl-containing organopolysiloxane (A1) and a hydrosilyl-containing compound (A2) wherein the alkenyl-containing organopolysiloxane (A1) is dissolved in an organic solvent, and after a platinum-based metal catalyst of the hydrosilylation reaction is added thereinto, the hydrosilyl-containing compound (A2) is gradually added into the resulting mixture with heating at 50 to 150° C. The platinum-based metal catalyst is the catalyst to facilitate the hydrosilylation reaction with the SiH group; and illustrative example of the addition reaction catalyst includes; a platinum group metal catalyst such as a platinum-based catalyst, including platinum black, platinic chloride, chloroplatinic acid, a reaction product between chloroplatinic acid and a monovalent alcohol, a complex of chloroplatinic acid with an olefins, and platinum bisacetoacetate; a palladium-based catalyst; and a rhodium-based catalyst. Meanwhile, this catalyst is used with the amount enough to effect the addition reaction; and usually, the amount thereof, as a platinum group metal, is preferably about 1 to 800 ppm, or especially preferably about 2 to 300 ppm, relative to the mass of the component (A1).

Similarly to the above, the reaction between the hydrosilyl-containing organopolysiloxane (A3) and the alkenyl-containing compound (A4) can be done by mixing them with heating in the presence of an addition reaction catalyst to obtain the organopolysiloxane whose molecular weight is increased.

Molecular weight of the organopolysiloxane after these hydrosilylation reactions influences to properties of the temporary adhesive, especially to thermal deformation during heating, void formation in the adhesion interface, and so on.

Weight-average molecular weight Mw of the polyorganosiloxane whose molecular weight is increased is preferably 15,000 or more after the addition reaction, as measured by GPC (gel permeation chromatography) by using a calibration curve relative to the polystyrene standard. When the weight-average molecular weight is 15,000 or more, the organopolysiloxane having excellent heat resistance can be obtained. The weight-average molecular weight thereof is more preferably in the range of about 20,000 to 200,000, or still more preferably about 30,000 to 150,000.

This non-aromatic saturated hydrocarbon group-containing organopolysiloxane may be used by either of the following methods: it is made to a film in advance followed by adhering this film to the wafer by using a roll laminator and so on, or its solution is applied onto the wafer by a spin coating method, a roll coater method, and so on. When these layers (A) and (A') are formed on the wafer by a spin coating method and so on, the resin is preferably applied as its solution followed by heat-drying; and in this case, hydrocarbon solvents such as pentane, hexane, cyclohexane, decane, isododecane, and limonene are preferably used. Here, concentration of the solid component in the layers of (A) and (A') is preferably in the range of 5 to 70%, and they may be the same or different each other. Film thickness of the layers (A) and (A') is preferably in the range of 0.1 to 30 μm, or preferably 0.5 to 10 μm, and film thickness of the layers of (A) and (A') may be the same or different each other. When the thickness thereof is 0.1 μm or more, an uneven surface of the device wafer can be covered sufficiently well, and when the thickness is 30 μm or less, there is no fear of forming a crack in the film; and thus, this range is preferable. Meanwhile, in order to enhance heat resistance further, this thermoplastic siloxane may be added with a filler such as silica with the amount thereof being 50 or less parts by mass.

1.2 Second Temporary Adhesive Layer (B): Thermosetting-Modified Siloxane Polymer Layer A cured product of a thermosetting composition, mainly comprised of a thermosetting-modified siloxane polymer shown by the general formula (5) or (6), may be used as the second temporary adhesive layer (B).

Polymer Shown by the General Formula (5):

A silphenylene-containing polymer having a repeating unit shown by the following general formula (5) with the weight-average molecular weight thereof being 3,000 to 500,000,

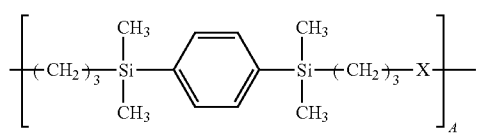

-continued

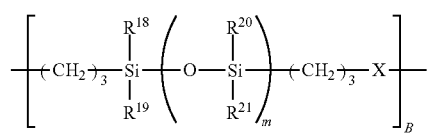

wherein $R^{18}$ to $R^{21}$ represent the same or different monovalent hydrocarbon group having 1 to 8 carbon atoms such as an alkyl group; "m" represents an integer of 1 to 100; A is a positive number and B is 0 or a positive number; and X represents a divalent organic group shown by the following general formula (7),

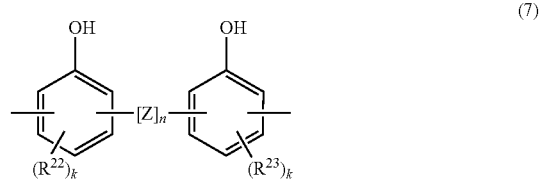

wherein Z represents a divalent organic group selected from any of

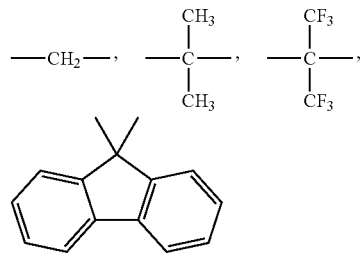

wherein, "n" represents 0 or 1; each of $R^{22}$ and $R^{23}$ represents the same or different alkyl or alkoxy group having 1 to 4 carbon atoms; and "k" represents any of 0, 1, and 2.

In this case, specific example of $R^{18}$ to $R^{21}$ includes a methyl group, an ethyl group, and a phenyl group; and "m" represents an integer of preferably 3 to 60, or more preferably 8 to 40. Further, B/A is 0 to 20, especially 0.5 to 5.

Polymer Shown by the General Formula (6):

An epoxy group-containing silicone polymer having a repeating unit shown by the following general formula (6) with the weight-average molecular weight thereof being 3,000 to 500,000,

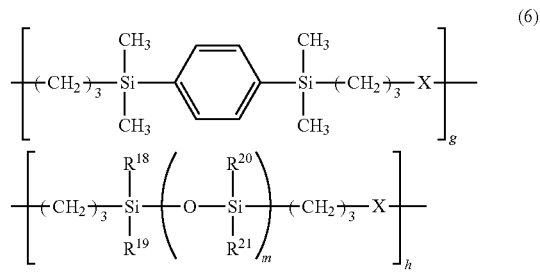

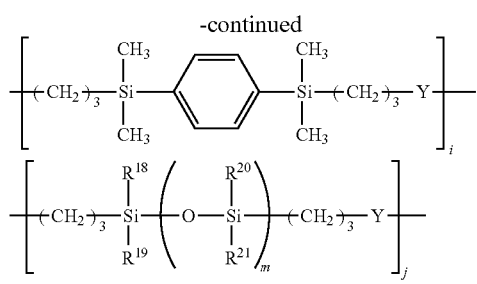

wherein $R^{18}$ to $R^{21}$ represent the same or different monovalent hydrocarbon group having 1 to 8 carbon atoms such as an alkyl group; "m" represents an integer of 1 to 100; "g", "h", "i", and "j" represent a positive number or 0 and satisfy $0<(i+j)/(g+h+i+j)\leq 1.0$. or preferably $0.1\leq(i+j)/(g+h+i+j)\leq 0.8$, and "i" and "j" are not 0 at the same time; X represents a divalent organic group shown by the following general formula (7); and Y represents a divalent organic group shown by the following general formula (8),

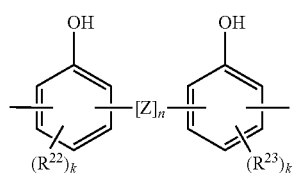 (7)

wherein Z represents a divalent organic group selected from any of

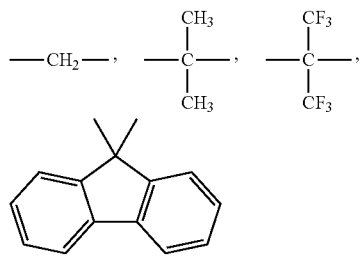

wherein, "n" represents 0 or 1; each of $R^{22}$ and $R^{23}$ represents the same or different alkyl or alkoxy group having 1 to 4 carbon atoms; and "k" represents any of 0, 1, and 2,

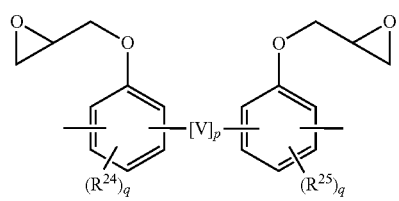 (8)

wherein V represents a divalent organic group selected from any of

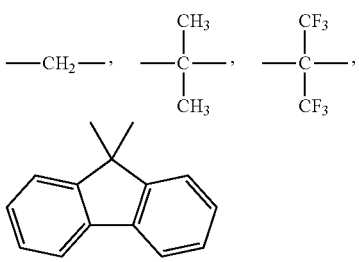

wherein, "p" represents 0 or 1; each of $R^{24}$ and $R^{25}$ represents the same or different alkyl or alkoxy group having 1 to 4 carbon atoms; and "q" represents any of 0, 1, and 2.

In this case, specific examples of $R^{18}$ to $R^{21}$ and "m" are the same as above.

In order to effect thermal cure, a thermosetting composition mainly comprised of the thermosetting-modified siloxane polymer shown by the formula (5) or (6) contains one or more kinds of crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule.

Especially, the composition may contain a two-functional, a three-functional, or a four or more multifunctional crosslinking agent, in particular, an epoxy resin such as EOCN-1020, EOCN-102S, XD-1000, NC-2000-L, EPPN-201, GAN, NC6000 (all of these are manufactured by Nippon Kayaku Co., Ltd.), and those shown by the following formulae.

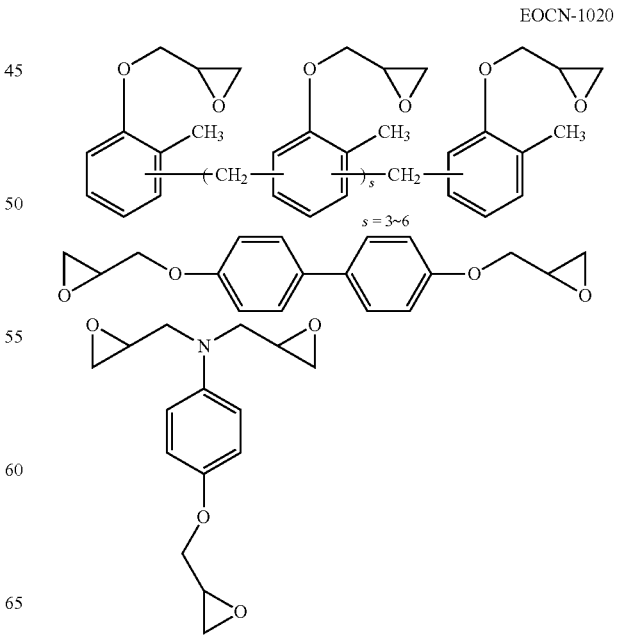

EOCN-1020

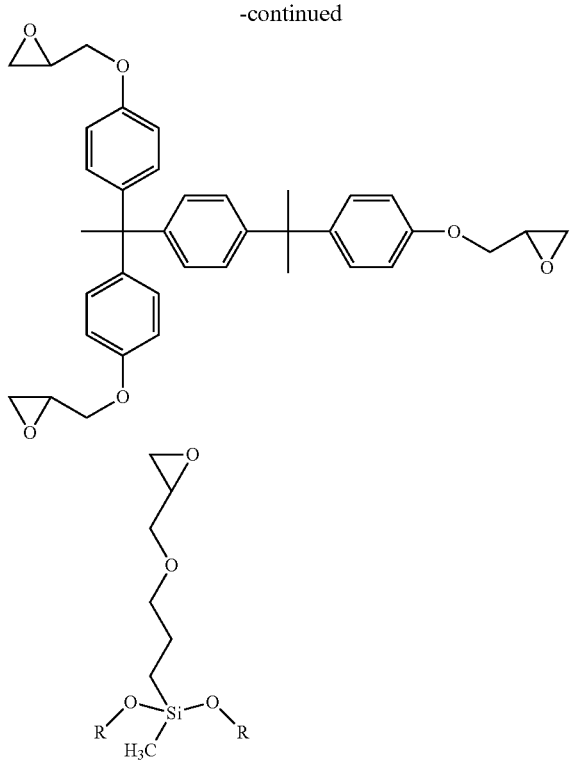

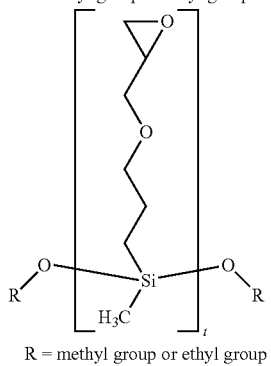

R = methyl group or ethyl group
t = 1  20%
t = 2  75%
t ≥ 3  5%

Amount of the crosslinking agent to be blended is 0.1 to 50 parts by mass, preferably 0.1 to 30 parts by mass, or more preferably 1 to 20 parts by mass, relative to 100 parts by mass of the thermosetting-modified siloxane polymer, while two, or three or more of them may be added as a mixture.

In addition, this composition may contain a curing catalyst such as an acid anhydride with the amount thereof being 5 or less parts by mass.

On the other hand, this composition may be laminated, as a film, on the layer of (A) which is formed on the wafer, or on the side of the supporting body which is used to manufacture a thin wafer. Further, this composition may be applied, after it is dissolved in a solution, onto the layer of (A) or onto the supporting body by such methods as a spin coating method, a roll coater method, and a die coating method. Illustrative example of the solvent for this operation includes ketones such as cyclohexanone, cyclopentanone, and methyl-2-n-amyl ketone; alcohols such as 3-methoxy butanol, 3-methyl-3-methoxy butanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used singly or as a mixture of two or more of them.

On the other hand, this composition may be laminated, as a film, on the layer of (A) which is formed on the wafer, or over the side of the supporting body which is used to manufacture a thin wafer. This composition may be applied, after it is dissolved in a solution, onto the layer of (A) or onto the layer of (A') by such methods as a spin coating method, a roll coater method, and a die coating method. Illustrative example of the solvent for this operation includes ketones such as cyclohexanone, cyclopentanone, and methyl-2-n-amyl ketone; alcohols such as 3-methoxy butanol, 3-methyl-3-methoxy butanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used singly or as a mixture of two or more of them.

Meanwhile, in order to enhance heat resistance further, this composition may be added with a heretofore known antioxidant and a filler such as silica, with the amount thereof being 50 or less parts by mass.

The second temporary adhesive layer (B) is preferably formed so as to give film thickness being 10 to 200 μm after curing, or preferably 20 to 120 μm. When the film thickness is 10 μm or more, the film can fully withstand a grinding process to thin a wafer, while when it is 200 μm or less, the film can withstand an actual process because there is no fear of causing resin deformation in a heat treatment process such as a TSV formation process; and thus, this film thickness is desirable.

2. Method for Manufacturing a Thin Wafer

A method for manufacturing a thin wafer of the present invention is characterized by using a temporary adhesive layer comprised of the foregoing two layers of (A) and (B) as the adhesive layer to bond a supporting body to a wafer which has a semiconductor circuit and so on. Thickness of the thin wafer that is manufactured by the method of the present invention is typically 5 to 300 μm, or more typically 10 to 100 μm.

A method for manufacturing a thin wafer of the present invention is characterized by using a temporary adhesive layer comprised of the foregoing three layers of (A), (B), and (A') as the adhesive layer to bond a supporting body to a wafer which has a semiconductor circuit and so on. Thickness of the thin wafer that is manufactured by the method of the present invention is typically 5 to 300 μm, or more typically 10 to 100 μm.

A method for manufacturing a thin wafer according to the present invention comprises steps of (a) to (c):

(a) a step of grinding or polishing of the non-circuit formed surface of the wafer in the wafer process body, (b) a step of processing of the non-circuit formed surface of the wafer, and (c) a step of detaching the processed wafer from the supporting body.

Detachment of the processed wafer from the supporting body in the step (c) is preferably done by a method wherein, after a dicing tape is adhered on the processed surface of the processed wafer, surface of the dicing tape is vacuum-adhered onto a suction surface, and then, the supporting body is detached by peeling-off from the processed wafer with the temperature of the suction surface being in the range of 10 to 100° C.

After detachment of the processed wafer from the supporting body in the step (c), it is preferable to carry out (d) a step of removing the non-aromatic saturated hydrocarbon group-containing organopolysiloxane layer (A) which is remained on a circuit-formed surface of the detached wafer.

Method for Manufacturing a Wafer Process Body

A wafer process body can be obtained by bonding a supporting body to a circuit-formed surface of a wafer, which has a circuit formed front surface while having non-circuit-formed back surface, via the temporary adhesive layer comprised of two layers of the first temporary layer (A) and the second temporary layer (B).

The wafer which has a circuit-formed surface and a non-circuit-formed surface is the wafer which has the circuit on one surface while not having the circuit on the other surface. The wafer to which the present invention can be applied is usually a semiconductor wafer. Illustrative example of the semiconductor wafer includes, not only a silicon wafer, but also a germanium wafer, a gallium-arsenic wafer, a gallium-phosphorous wafer, and gallium-arsenic-aluminum wafer and so on. Although thickness of the wafer is not particularly restricted, it is typically 600 to 800 µm, or more typically 625 to 775 µm.

As to the supporting body, a substrate such as a silicon wafer, a glass, and a quartz wafer can be used. In the present invention, irradiation of a radiation energy beam to the temporary adhesive layer through the supporting body is not necessary, so that light-transmitting property is not necessary in the supporting body.

Each of the temporary adhesive layers (A) and (B) can be formed on the wafer and the supporting body as the film, or by applying to the wafer and the supporting body as a solution thereof by such a method as spin coating. In this case, after spin-coating, the layers are used after prebaking thereof at 80 to 190° C. in accordance with evaporation condition of the used solvent. Alternatively, after films of the first temporary adhesive layer (A) and the second temporary adhesive layer (B) are adhered with each other in advance, they may be used for bonding so that the first temporary adhesive layer (A) is adhered to the wafer side and the second temporary adhesive layer (B) is adhered to the supporting body side.

The wafer and the supporting body formed with the temporary adhesive layers (A) and (B) are used as a substrate which is bonded via the temporary adhesive layers (A) and (B). In this process, this substrate is adhered by uniform compression under reduced pressure at the temperature range of preferably 40 to 230° C., or more preferably 40 to 200° C. whereby forming a stacked substrate in which the wafer and the supporting body which are bonded together.

As to the instrument for bonding of the wafer, a commercially available wafer bonding instrument, such as EVG520IS and 850TB (manufactured by EVG Inc.), and XBC300 (manufactured by SUSS MicroTech AG) may be used.

Thereafter, the thermosetting-modified siloxane polymer layer (B) is cured by heat treatment thereof preferably at 100 to 260° C., or more preferably at 140 to 220° C., for the time of 10 minutes to 5 hours, or preferably 30 minutes to 2 hours to obtain the wafer process body.

Method for Manufacturing a Wafer Process Body

A wafer process body can be obtained by bonding a supporting body to a circuit-formed surface of a wafer which has a circuit formed front surface while having non-circuit-formed back surface via the temporary adhesive layer comprised of three layers of the (A), (B), and (A').

The wafer which has a circuit-formed surface and a non-circuit-formed surface is the wafer which has the circuit on one surface while not having the circuit on the other surface. The wafer to which the present invention can be applied is usually a semiconductor wafer. Illustrative example of the semiconductor wafer includes, not only a silicon wafer, but also a germanium wafer, a gallium-arsenic wafer, a gallium-phosphorous wafer, and gallium-arsenic-aluminum wafer. Although thickness of the wafer is not particularly restricted, it is typically 600 to 800 µm, or more typically 625 to 775 µm.

As to the supporting body, a substrate such as a silicon wafer, a glass, and a quartz wafer can be used. In the present invention, irradiation of a radiation energy beam to the temporary adhesive layer through the supporting body is not necessary, so that light-transmitting property is not necessary in the supporting body.

Each of the layers (A), (B), and (A') can be formed over the wafer and the supporting body as the film, or by applying to the wafer and the supporting body as a solution thereof by such a method as spin coating. In this case, after spin coating, the layers are used after prebaking thereof at 80 to 190° C. in accordance with evaporation condition of the used solvent. Alternatively, after films of the layers (A), (A') and (B) are adhered with each other, they may be used such that the layer (A) is adhered to the wafer side and the layer (A') is adhered to the supporting body side.

The wafer and the supporting body formed with the layers of (A), (B), and (A') are used as a substrate which is bonded via the layers (A), (B), and (A'). In this process, this substrate is adhered by uniform compression under reduced pressure at the temperature range of preferably 40 to 230° C., or more preferably 40 to 200° C. whereby forming a wafer process body (stacked substrate) in which the wafer and the supporting body which are bonded together.

As to the instrument for bonding of the wafer, a commercially available wafer bonding instrument, such as EVG520IS and 850TB (manufactured by EVG Inc.), and XBC300 (manufactured by SUSS MicroTech AG) may be used.

Thereafter, the thermosetting-modified siloxane polymer layer (B) is cured by heat treatment thereof preferably at 100 to 260° C., or more preferably at 140 to 220° C., for the time of 10 minutes to 5 hours, or preferably 30 minutes to 2 hours to obtain the wafer process body.

Step (a)

Step (a) is the step of grinding or polishing of the non-circuit-formed surface of the wafer in the wafer process body which is bonded to the supporting body, in other words, a step of grinding or polishing of a wafer's back surface of the wafer process body which is obtained by bonding as mentioned above, thereby thinning the wafer. Method for grinding or polishing of the wafer's back surface is not particularly restricted, so that a heretofore known method may be used. It is preferable that grinding be carried out with cooling the wafer and a rubstone (such as diamond) by pouring water thereonto. As to the instrument of grinding the wafer's back surface, for example, DAG-810 (trade name, manufactured by DISCO Corp.) may be used.

Step (b)

Step (b) is the step of processing of the non-circuit-formed surface of the wafer process body which has been grinded or polished, namely, the step of processing of surface of the wafer not formed with a circuit in the wafer process body which has been thinned by grinding (or polishing) of its back surface. This step includes various processes used in the wafer level. Illustrative example thereof includes electrode formation, metal wiring formation, and protection film formation, and so on. More specific example thereof includes heretofore know processes such as metal spattering to form an electrode and so on, wet etching to etch a metal spattering layer, resist coating to make a mask for metal wiring formation, pattern formation by exposure and development, resist removal, dry etching, formation of a metal plating, silicon etching to form TSV, and formation of an oxide film on silicon surface.

Step (c)

The step (c) is the step of detaching the wafer which is processed in the step (b) from the wafer process body, namely, the step of detaching, before dicing, the thinned wafer having treated with various processes from the wafer process body. There are several detaching methods including: (1) both of them are separated by sliding horizontally to the opposite directions with heating mainly the wafer and the supporting body (preferably at 200 to 250° C.); (2) one of the wafer or the supporting body of the wafer process body is fixed horizontally while the other is lifted up with a certain angle from the horizontal direction; and (3) a protective film is adhered on the processed surface of the processed wafer, and then the wafer and the protective film are detached from the wafer process body by peeling; and any of these methods may be used without particular restriction.

The present invention can be applied to the every method mentioned above; but the method wherein one of the wafer and the supporting body of the wafer process body is fixed horizontally while the other is lifted up with a certain angle from the horizontal direction and the method wherein a protective film is adhered on the processed surface of the processed wafer, and then the wafer and the protective film are detached by peeling may be applied more suitably. These detachment methods are usually carried out at room temperature.

In addition, detachment of the supporting body from the processed wafer is readily done by a method wherein, after a dicing tape is adhered on the processed surface of the processed wafer, surface of the dicing tape is vacuum-adhered onto a suction surface, and then, the supporting body is detached by peeling-off from the processed wafer with the temperature of the suction surface being in the range of 10 to 100° C.; and in addition, the dicing process thereafter can also be done readily.

Step (d)

The step (d) is the step of removing the temporary adhesive layer (A), if part of it is remained on the circuit-formed surface of the detached wafer. On the circuit-formed surface of the wafer which is detached from the supporting body in the step (c), there is a certain instance that a part of the temporary adhesive layer (A) is remained; and this remained (A) may be removed, for example, by cleaning the wafer. In cleaning in the step (d), any of cleaning liquids which can dissolve the non-aromatic saturated hydrocarbon group-containing organopolysiloxane, which is the layer (A) of the temporary adhesive layer; and specific example thereof includes pentane, hexane, cyclohexane, decane, isododecane, and limonene. These solvents may be used singly or as a combination of two or more of them. If removal is difficult, a base or an acid may be added to the above-mentioned solvents. Illustrative example of the usable base includes; amines such as ethanolamine, diethanolamine, triethanolamine, triethylamine, and ammonia; and an ammonium salt such as tetramethylammonium hydroxide. Illustrative example of the usable acid includes; organic acids such as acetic acid, oxalic acid, benzene sulfonic acid, and dodecylbenzene sulfonic acid. Addition amount of them is 0.01 to 10% by mass, or preferably 0.1 to 5% by mass, as the concentration thereof in the cleaning solution. To improve removal efficiency of the residual matters, a heretofore known surfactant may be added thereinto. Cleaning may be done with a paddle method by using the above-mentioned liquid, with a spraying method, and with a soaking method in a cleaner tank. Temperature in this operation is 10 to 80° C., or preferably 15 to 65° C.; and if necessary, after the layer of (A) is dissolved by these dissolving solutions, it may be rinsed with water or an alcohol at the end of cleaning, and thereafter, drying may be done to obtain a thinned wafer.

EXAMPLES

Hereinafter, the present invention will be explained specifically by showing Examples and Comparative Examples; but the present invention is not limited by the following Examples.

Synthesis of Organopolysiloxane

Synthesis Example 1

Into a 1-L flask equipped with a stirrer, a cooling equipment, and a thermometer were taken 234 g (13 moles) of water and 35 g of toluene; and then, they were heated at 80° C. in an oil bath. Into a dropping funnel were taken 183.6 g (0.8 mole) of norbornyl trichloro silane, 12.9 g (0.1 mole) of dimethyl dichloro silane, and 10.9 g (0.1 mole) of trimethyl chloro silane; and then, this mixture was gradually added into the flask in one hour with stirring. After completion of the addition, heating was further continued for aging at 80° C. for one hour. The resulting mixture was cooled statically to room temperature, and then, the separated aqueous layer was removed. After the organic layer was mixed with a 10% aqueous solution of sodium sulfate with stirring for 10 minutes, this mixture was allowed to stand for 30 minutes, and then, the separated aqueous layer was removed. This washing operation by water to remove the separated aqueous layer was repeated until the toluene layer becomes neutral to terminate the reaction. After an ester adapter was equipped, the toluene layer that contained the organopolysiloxane was refluxed by heating to remove water from the toluene layer; and this heating was continued further one hour after the inner temperature reached 110° C., and then, the solution was cooled to room temperature. After the organopolysiloxane solution thus obtained was filtrated to remove insoluble matters, toluene was removed by vacuum distillation to obtain 134 g of solid organopolysiloxane (Resin 1).

The obtained organopolysiloxane (Resin 1) contained 80 mol % of the T Unit, 10 mol % of the D unit, and 10 mol % of the M Unit. In addition, 0.1 mole of the terminal silanol group per 100 g of the organopolysiloxane (Resin 1). The appearance thereof was a colorless and transparent solid with the weight-average molecular weight of 7,100. Content of the norbornyl group relative to totality of the organic groups and the hydrogen atoms was 61%. In addition, 80% of totality of the organic groups and the hydrogen atoms shown by $R^1$ to $R^3$ was the norbornyl group. This organopolysiloxane (Resin 1) was dissolved into isododecane with the solid concentration thereof being 20%, and the resulting solution was filtrated through a 0.2-μm membrane filter to obtain a resin solution (A-1). Similarly, this compound was dissolved with the solid concentration thereof being 10%, and the resulting solution was filtrated through a 0.2-μm membrane filter to obtain a resin solution (A'-1).

Synthesis Example 2

Similarly to Synthesis Example 1, 234 g (13 moles) of water and 35 g of toluene were taken into a 1-L flask; and then, they were heated at 80° C. in an oil bath. The subsequent procedures were followed similarly to Synthesis Example 1 except that 206.6 g (0.9 mole) of norbornyl trichloro silane, 7.1 g (0.05 mole) of methyl vinyl dichloro silane, and 5.4 g (0.05 mole) of trimethyl chloro silane were taken into a dropping funnel; and as a result, 140 g of a solid organopolysiloxane (Resin 2) was obtained.

The obtained organopolysiloxane contained 90 mol % of the T Unit, 5 mol % of the D unit, and 5 mol % of the M Unit. In addition, 0.1 mole of the terminal silanol group and 0.034 mole of the terminal vinyl group per 100 g of the organopolysiloxane. The appearance thereof was a colorless and transparent solid with the weight-average molecular weight of 5,900. Contents of the norbornyl group and the vinyl group, relative to totality of the organic groups and the hydrogen atoms were 78 mol % and 4.3 mol %, respectively. In addition, 90% of totality of the organic groups and the hydrogen atoms shown by $R^1$ to $R^3$ was the norbornyl group.

Synthesis Example 3

As the alkenyl-containing oreganopolysiloxane (A1), 100 g of the solid organopolysiloxane (Resin 2) obtained by Synthesis Example 2 was dissolved into 100 g of toluene to obtain a solution with the solid concentration thereof being 50%. Into this solution was added a platinum catalyst with the amount thereof being 20 ppm as the platinum atom relative to the resin; and then, 27.5 g of the compound (SiH equivalent of 1473 g/mol) shown by the following formula (9) as the hydrosilyl-containing compound (A2) was gradually added thereinto at 60° C. At this time, heat generation due to the reaction was recognized. This amount corresponds to 0.55 of the H/Vi ratio (ratio of the SiH group to totality of the alkenyl group). The reaction was carried out at 100° C. for two hours to complete the reaction. Thereafter, toluene was removed by vacuum distillation to obtain a solidified reaction product, which was then redissolved into isododecane. The resulting solution was filtrated through a 0.2-μm membrane filter to obtain a resin solution (A-2) with the solid concentration thereof being 20%. Similarly, this compound was dissolved with the solid concentration thereof being 10%, and the resulting solution was filtrated through a 0.2-μm membrane filter to obtain a resin solution (A'-2). Further, an isododecane solution with the solid concentration thereof being 65% was filtrated through a 1.0-μm membrane filter to obtain a resin solution (A-3). The weight-average molecular weight Mw of this resin measured by GPC was 30,000.

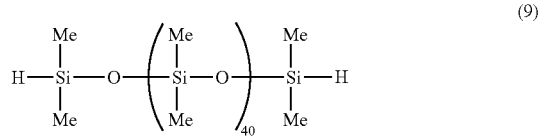

(9)

(In the formula, Me represents a methyl group.)

Synthesis Example 4

Into a flask equipped with a stirrer, a thermometer, a nitrogen-displacing equipment, and a reflux condenser were taken 43.1 g of 9,9'-bis(3-allyl-4-hydroxyphenyl)fluorene (M-1), 29.5 g of organohydrogen siloxane shown by the average composition formula (M-3), 135 g of toluene, and 0.04 g of chloroplatinic acid; and then, they were heated to 80° C. Thereafter, 17.5 g of 1,4-bis(dimethylsilyl)benzene (M-5) was gradually added into the flask in one hour. At this time, temperature inside the flask went up to 85° C. After completion of the addition, heating was further continued for aging at 80° C. for two hours. Thereafter, toluene was removed by distillation, and then 43 g of cyclohexanone was added thereinto to obtain a cyclohexanone solution of the resin with the resin solid concentration thereof being 65% by mass. Molecular weight of the resin in this solution as measured by GPC was 45,000 as the weight-average molecular weight relative to polystyrene. To 50 g of this resin solution were added 5 g of hexamethoxy methylol melamine (NIKALAC MW-390: manufactured by Sanwa Chemical Co., Ltd.) and 0.2 g of bis(t-butylsulfonyl)diazomethane (BSDM: manufactured by Wako Pure Chemical Industries, Ltd.); and then, the resulting solution was filtrated through a 1.0-μm membrane filter to obtain a resin solution (B-1).

Synthesis Example 5

Into a 5-L flask equipped with a stirrer, a thermometer, a nitrogen-displacing equipment, and a reflux condenser were taken 396.9 g of the compound (M-1), 45.0 g of the compound (M-2), and 1,875 g of toluene for dissolution; and then, 949.6 g of the compound (M-3) and 6.1 g of the compound (M-4) were added into the flask. After the flask was heated to 60° C., 2.2 g of carbon-supported platinum catalyst (5% by mass) was added thereinto; and after it was confirmed that the inside temperature of the reaction mixture went up to 65 to 67° C., and heating was continued at 90° C. for 3 hours. After the temperature was lowered to 60° C. again, 2.2 g of carbon-supported platinum catalyst (5% by mass) was added; and then, 107.5 g of the compound (M-5) was gradually added into the flask in one hour. At this time, temperature inside the flask went up to 78° C. After completion of the gradual addition, aging was continued at 90° C. for 3 hours; and after this was cooled to room temperature, 1,700 g of methyl isobutyl ketone (MIBK) was added thereinto, and then this reaction solution was filtrated by compression to remove the platinum catalyst. Into this polymer solution thus obtained was added 760 g of pure water; and then, the resulting mixture was stirred and settled to separate into the layers, whereby removing the lower aqueous layer. This operation of phase separation and water washing was repeated for 6 times to remove the minute acid component present in the polymer solution. The solvents in this resin solution were removed by vacuum distillation; and then, 767 g of cyclopentanone was added thereinto to obtain a cyclopentanone solution of the resin with the solid concentration thereof being 60% by mass. Molecular weight of the resin in this resin solution as measured by GPC was 62,000 as the weight-average molecular weight relative to polystyrene; and (i+j)/(g+h+i+j) in the formula (6) was 0.10. To 100 g of this resin solution were added 16 g of epoxylated cresol novolak (EOCN1020-55: manufactured by Nippon Kayaku Co., Ltd.) and 0.2 g of tetrahydrophthalic anhydride (RIKACID HH-A: manufactured by New Japan Chemical Co., Ltd.); and then, the resulting solution was filtrated through a 1.0-μm membrane filter to obtain a resin solution (B-2).

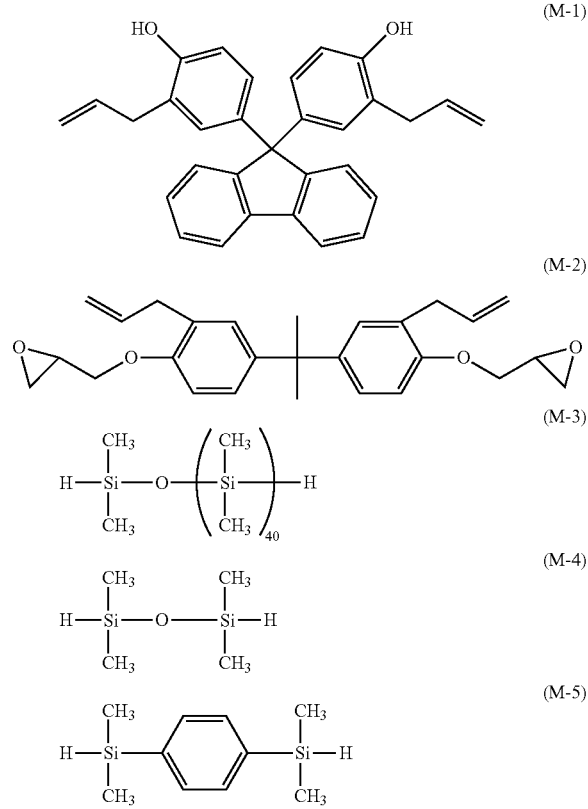

Examples 1 to 3 and Comparative Examples 1 to 2

To a 200-mm silicon wafer (thickness of 725 µm) whose entire front surface was formed with copper posts having height of 50 µm and diameter of 60 µm were applied (A-1) and (A-2) by spin coating with the film thickness as shown in Table 1 to form a film on the wafer's bump-formed surface. At this time, after resin coating, it was heat-treated on a hot plate at 150° C. for 2 minutes. On the other hand, to a glass plate (supporting body: diameter of 200 mm and thickness of 700 µm) were applied (B-1) and (B-2) by spin coating to form a film with the film thickness as shown in Table 1. At this time, after resin coating, it was heat-treated on a hot plate at 120° C. for 2 minutes. The silicon wafer and the glass plate having the resin layer on both or any one of them were bonded in a vacuum adhesion equipment such that each of the resin surfaces may be facing; by so doing, a stacked substrate was prepared (compression adhesion condition). Bonding of the 200-mm wafer was done with a wafer bonding instrument EVG520IS (manufactured by EVG Inc.). Bonding was done at the bonding temperature shown in Table 1, with the chamber pressure of $10^{-3}$ mbar or lower, and with the load of 5 kN.

Thereafter, the following tests were carried out. The results thereof are shown in Table 1.

Adhesion Test

After bonding, the substrate is once heated in an oven at 180° C. for one hour to cure the second temporary adhesive layer (B), and then, it was cooled to room temperature to visually check the interface as to the adhesion state thereof. If there was no abnormity such as foaming in the interface, it was judged to be good (shown by "G"), and if there was abnormity, it was judged to be not good (shown by "NG").

Test of Back Surface Grinding Resistance

Back surface of the silicon wafer was grinded by using a grinder DAG810 (manufactured by DISCO Corp.) with a diamond rubstone. After grinding was made to the final substrate thickness of 50 µm, abnormity such as crack and peel was checked by an optical microscope (100-folds). If there was no abnormity, it was judged to be good (shown by "G"), and if there was abnormity, it was judged to be not good (shown by "NG").

Test of Heat Resistance

The laminate after back surface of the silicon wafer was grinded was kept under nitrogen atmosphere in an oven at 250° C. for 2 hours; and then, after it was heated on a hot plate at 270° C. for 10 minutes, abnormity thereof was checked as to its appearance. If there was no abnormity in appearance, it was judged to be good (shown by "G"), and if there was abnormity in appearance, it was judged to be not good (shown by "NG").

Detachability Test

In the peeling test of the substrate, onto the wafer side which was thinned to 50 µm was adhered a dicing tape by using a dicing frame; and then, this dicing tape surface was set to a suction plate by vacuum adhesion. Then, one point of a glass was lifted up by tweezers at room temperature to detach the glass substrate. If detaching could be done without breakage of the glass supporting body and the 50-µm wafer, it was judged to be good (shown by "G"), and if there was abnormity such as crack, it was judged to be not good (shown by "NG").

Cleaning Removal Test

The 200-mm wafer adhered to a dicing frame via the dicing tape after the foregoing detaching test (this was subjected to the test of heat resistance) was set to a spin coater with the adhesive layer being up. Then, an isododecane cleaning solvent was sprayed for 3 minutes, and then, isopropyl alcohol (IPA) was sprayed for rinsing with rotating the wafer. Thereafter, appearance was visually observed to check whether or not the adhesive resin was remained. If there was no remaining resin, it was judged to be good (shown by "G"), and if there was remaining resin, it was judged to be not good (shown by "NG").

TABLE 1

| | Example 1 | Example 2 | Example 3 | Comparative Example 1 | Comparative Example 2 |
|---|---|---|---|---|---|
| Resin layer (A) | (A-1) | (A-2) | (A-2) | (A-3) | None |
| (A) Film thickness | 4 µm | 5 µm | 5 µm | 70 µm | — |
| Resin layer (B) | (B-1) | (B-1) | (B-2) | None | (B-1) |
| (B) Film thickness | 60 µm | 60 µm | 100 µm | — | 60 µm |
| Bonding temperature | 160° C. | 160° C. | 120° C. | 260° C. | 160° C. |
| Adhesion | G | G | G | G | G |
| Back surface grinding resistance | G | G | G | G | G |
| Heat resistance | G | G | G | G | G |
| Detachability | G | G | G | NG | NG |
| Cleaning efficiency | G | G | G | — | — |

As shown in Comparative Example 1, if the layer of (B) was not present, such a high temperature of 260° C., at which temperature there is a possibility to cause a damage to the wafer during bonding, was necessary; and on top of this, because the adhesion strength of the layer of (A) to the glass supporting body and to the wafer was so high that the glass supporting body was broken during the time of detaching. As shown in Comparative Example 2, if the layer of (A) was not present, the wafer was come off from the vacuum suction plate so that detaching itself was not possible. On the other hand, in Examples 1 to 3, not only the bonding could be done at low temperature where there is no damage to the wafer but also detachment could be done beautifully from the interface of the layer (A) and the layer (B).

Examples 4 to 6 and Comparative Examples 3 to 4

To a 200-mm silicon wafer (thickness of 725 µm) whose entire surface was formed with copper posts having height of 50 µm and diameter of 60 µm were applied (A-1) and (A-2) by spin coating with the film thickness as shown in Table 2 to form a film on the wafer bump-formed surface. At this time, after resin coating, it was heat-treated on a hot plate at 150° C. for 2 minutes. On the other hand, to a glass plate (supporting body: diameter of 200 mm and thickness of 700 µm) were applied firstly the layers of (A'-1) and (A'-2) by spin coating, and then, (B-1) and (B-2) were applied onto the layers of (A'-1) and (A'-2) by spin coating to form two layers of the polyorganosiloxane layer (A') and the thermosetting-modified siloxane layer (B). At this time, after coating of the layers of (A'-1) and (A'-2), it was heat-treated on a hot plate at 150° C. for 2 minutes; and after coating of the layers of (B-1) and (B-2), it was heat-treated on a hot plate at 120° C. for 2 minutes. The silicon wafer and the glass plate having the resin layer were bonded under the condition shown in Table 2 in a vacuum bonding equipment such that each of the resin surfaces may be facing; by so doing, a stacked body was prepared (compression adhesion condition).

Thereafter, the following tests were carried out. The results thereof are shown in Table 2.

Adhesion Test

Bonding of the 200-mm wafer was done with a wafer bonding instrument EVG520IS (manufactured by EVG Inc.). Bonding was done at the adhesion temperature (bonding temperature) shown in Table 2, with the chamber pressure of $10^{-3}$ mbar or lower, and with the load of 5 kN. After bonding, the substrate is once heated in an oven at 180° C. for one hour to cure the layer (B), and then, it was cooled to room temperature to visually check the interface as to the adhesion state thereof. If there was no abnormity such as foaming in the interface, it was judged to be good (shown by "G"), and if there was abnormity, it was judged to be not good (shown by "NG").

Test of Back Surface Grinding Resistance

Back surface of the silicon wafer was grinded by using a grinder DAG810 (manufactured by DISCO Corp.) with a diamond rubstone. After grinding was made to the final substrate thickness of 50 µm, abnormity such as crack and peel was checked by an optical microscope (100-folds). If there was no abnormity, it was judged to be good (shown by "G"), and if there was abnormity, it was judged to be not good (shown by "NG").

Test of Heat Resistance

The laminate after back surface of the silicon wafer was grinded was kept under nitrogen atmosphere in an oven at 250° C. for 2 hours; and then, after it was heated on a hot plate at 270° C. for 10 minutes, abnormity thereof was checked as to its appearance. If there was no abnormity in appearance, it was judged to be good (shown by "G"), and if there was abnormity in appearance, it was judged to be not good (shown by "NG").

Detachability Test

In the detachability test of the substrate, onto the wafer side which was thinned to 50 µm was adhered a dicing tape by using a dicing frame; and then, this dicing tape surface was set to a suction plate by vacuum adhesion. Then, one point of a glass was lifted up by tweezers at room temperature to detach the glass substrate. If detachment could be done without breakage of the glass supporting body and the 50-µm wafer, it was judged to be good (shown by "G"), and if there was abnormity such as crack, it was judged to be not good (shown by "NG").

Cleaning Removal Test

The 200-mm wafer adhered to a dicing frame via the dicing tape after the foregoing detachability test (this was subjected to the test of heat resistance) was set to a spin coater with the adhesive layer being up. If the cured layer (B) was remained on the wafer, this was removed, and then, an isododecane cleaning solvent was sprayed for 3 minutes; and thereafter, isopropyl alcohol (IPA) was sprayed for rinsing with rotating the wafer. Then, appearance thereof was visually observed to check whether or not the adhesive resin was remained. If there was no remaining resin, it was judged to be good (shown by "G"), and if the remaining layer of (B) could not be removed or there was remaining resin, it was judged to be not good (shown by "NG").

TABLE 2

|  | Example 4 | Example 5 | Example 6 | Comparative Example 3 | Comparative Example 4 |
|---|---|---|---|---|---|
| Resin layer (A) | (A-1) | (A-2) | (A-2) | (A-3) | None |
| (A) Film thickness | 4 µm | 5 µm | 5 µm | 70 µm | — |
| Resin layer (B) | (B-1) | (B-1) | (B-2) | None | (B-1) |
| (B) Film thickness | 60 µm | 60 µm | 100 µm | — | 60 µm |
| Resin layer (A') | (A'-1) | (A'-2) | (A'-2) | (A'-2) | (A'-2) |
| (A') Film thickness | 1 µm | 1 µm | 1 µm | 1 µm | 1 µm |
| Bonding temperature | 160° C. | 160° C. | 120° C. | 260° C. | 160° C. |
| Adhesion | G | G | G | G | G |
| Back surface grinding resistance | G | G | G | G | G |
| Heat resistance | G | G | G | G | G |
| Detachability | G | G | G | NG | G |
| Cleaning efficiency | G | G | G | — | NG |

As shown in Comparative Example 3, if the layer of (B) was not present, such a high temperature of 260° C., at which temperature there is a possibility to cause a damage to the wafer during adhesion, was necessary; and on top of this, because the adhesion strength of the layer of (A) to the glass supporting body and to the wafer was so high that the glass supporting body was broken during the time of peeling off. As shown in Comparative Example 4, if the layer of (A) was not present, the layer of (B) remained on the wafer side, and this could not be removed, although peeling between the layers of (B) and (A') was possible. On the other hand, in Examples 4 to 6, not only the adhesion could be done at low temperature where there is no damage to the wafer but also removal could be done beautifully from the interface of the layer (A) and the layer (B) or the interface of the layer (A') and the layer (B).

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A wafer process body, wherein, in the wafer process body, a temporary adhesive layer is formed on a supporting body, and a wafer having a circuit-formed front surface and a to-be-processed back surface is stacked on the temporary adhesive layer, wherein the temporary adhesive layer comprises:
 a first temporary adhesive layer composed of a non-aromatic saturated hydrocarbon group-containing organopolysiloxane layer (A) which is adhered to the front surface of the wafer so as to be detachable and
 a second temporary adhesive layer composed of a thermosetting-modified siloxane polymer layer (B) which is stacked on the first temporary adhesive layer and adhered to the supporting body so as to be detachable.

2. A wafer process body, wherein in the wafer process body, a temporary adhesive layer is formed on a supporting body and a wafer having a circuit-formed front surface and a to-be-processed back surface is stacked on the temporary adhesive layer, wherein the temporary adhesive layer is a composite temporary adhesive layer having a three-layered structure comprised of:
 a first temporary adhesive layer composed of a non-aromatic saturated hydrocarbon group-containing organopolysiloxane layer (A) which is adhered to the front surface of the wafer so as to be detachable,
 a second temporary adhesive layer composed of a thermosetting-modified siloxane polymer layer (B) which is stacked on the first temporary adhesive layer, and
 a third temporary adhesive layer composed of a non-aromatic saturated hydrocarbon group-containing organopolysiloxane layer (A') which is similar to the first temporary adhesive layer; the layer (A') being stacked on the second temporary adhesive layer and adhered to the supporting body so as to be detachable.

3. The wafer process body according to claim 1, wherein the non-aromatic saturated hydrocarbon group-containing organopolysiloxane layers (A) and (A') are a non-aromatic saturated hydrocarbon group-containing organopolysiloxane layer which contains the units shown by the following formulae (I) to (III):
 (I) siloxane unit shown by $R^1 SiO_{3/2}$ (T Unit): 40 to 99 mol %,
 (II) siloxane unit shown by $R^2 R^3 SiO_{2/2}$ (D Unit): 59 mol % or less, and
 (III) siloxane unit shown by $R^4 R^5 R^6 SiO_{1/2}$ (M Unit): 1 to 30 mol %,
 wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

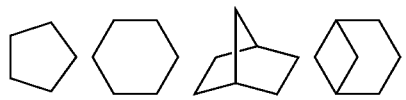

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms.

4. The wafer process body according to claim 2, wherein the non-aromatic saturated hydrocarbon group-containing organopolysiloxane layers (A) and (A') are a non-aromatic saturated hydrocarbon group-containing organopolysiloxane layer which contains the units shown by the following formulae (I) to (III):
 (I) siloxane unit shown by $R^1 SiO_{3/2}$ (T Unit): 40 to 99 mol %,
 (II) siloxane unit shown by $R^2 R^3 SiO_{2/2}$ (D Unit): 59 mol % or less, and
 (III) siloxane unit shown by $R^4 R^5 R^6 SiO_{1/2}$ (M Unit): 1 to 30 mol %,
 wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

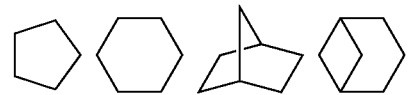

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms.

5. The wafer process body according to claim 1, wherein the non-aromatic saturated hydrocarbon group-containing organopolysiloxane layers (A) and (A') are an organopolysiloxane layer which is obtained by a hydrosilylation reaction between an alkenly-containing organopolysiloxane (A1) which are a non-aromatic saturated hydrocarbon group-containing organopolysiloxanes which contain the units shown by the following formulae (I) to (III):
 (I) siloxane unit shown by $R^1 SiO_{3/2}$ (T Unit): 40 to 99 mol %,
 (II) siloxane unit shown by $R^2 R^3 SiO_{2/2}$ (D Unit): 59 mol % or less, and
 (III) siloxane unit shown by $R^4 R^5 R^6 SiO_{1/2}$ (M Unit): 1 to 30 mol %,
 wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

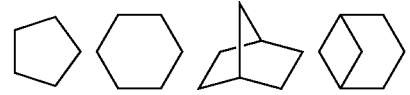

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms;

the alkenly-containing organopolysiloxane (A1) containing 2 to 30 mol % of an alkenyl group having 2 to 7 carbon atoms relative to totality of the organic groups and hydrogen atoms shown by the foregoing $R^1$ to $R^6$, and a hydrosilyl-containing compound (A2) with the amount thereof being 0.4 to 1.0-fold of the total SiH group relative to the total alkenyl group of the alkenyl-containing organopolysiloxane (A1), wherein the hydrosilyl-containing compound contains at least two SiH groups per one molecule and is shown by the following average composition formula (1), $$R^7{}_aR^8{}_bH_cSiO_{(4-a-b-c)/2} \quad (1)$$

wherein $R^7$ represents a monovalent organic group other than an alkenyl group; $R^8$ represents a divalent organic group; and "a", "b", and "c" represent positive numbers which satisfy $0<a\le2.5$, $0\le b\le1$, $0.75\le a+b\le2.5$, $0.005\le c\le1$, and $0.8\le a+b+c\le4$, in the presence of a platinum group metal-based catalyst.

6. The wafer process body according to claim 2, wherein the non-aromatic saturated hydrocarbon group-containing organopolysiloxane layers (A) and (A') are an organopolysiloxane layer which is obtained by a hydrosilylation reaction between an alkenly-containing organopolysiloxane (A1) which are a non-aromatic saturated hydrocarbon group-containing organopolysiloxanes which contain the units shown by the following formulae (I) to (III):

(I) siloxane unit shown by $R^1SiO_{3/2}$ (T Unit): 40 to 99 mol %, (II) siloxane unit shown by $R^2R^3SiO_{2/2}$ (D Unit): 59 mol % or less, and (III) siloxane unit shown by $R^4R^5R^6SiO_{1/2}$ (M Unit): 1 to 30 mol %, wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms;

the alkenly-containing organopolysiloxane (A1) containing 2 to 30 mol % of an alkenyl group having 2 to 7 carbon atoms relative to totality of the organic groups and hydrogen atoms shown by the foregoing $R^1$ to $R^6$, and a hydrosilyl-containing compound (A2) with the amount thereof being 0.4 to 1.0-fold of the total SiH group relative to the total alkenyl group of the alkenyl-containing organopolysiloxane (A1), wherein the hydrosilyl-containing compound contains at least two SiH groups per one molecule and is shown by the following average composition formula (1), $$R^7{}_aR^8{}_bH_cSiO_{(4-a-b-c)/2} \quad (1)$$

wherein $R^7$ represents a monovalent organic group other than an alkenyl group; $R^8$ represents a divalent organic group; and "a", "b", and "c" represent positive numbers which satisfy $0<a\le2.5$, $0\le b\le1$, $0.75\le a+b\le2.5$, $0.005\le c\le1$, and $0.8\le a+b+c\le4$, in the presence of a platinum group metal-based catalyst.

7. The wafer process body according to claim 1, wherein the non-aromatic saturated hydrocarbon group-containing organopolysiloxane layers (A) and (A') are an organopolysiloxane layer which is obtained by a hydrosilylation reaction between a hydrosilyl-containing organopolysiloxane (A3) which are a non-aromatic saturated hydrocarbon group-containing organopolysiloxanes which contain units shown by the following formulae (I) to (III):

(I) siloxane unit shown by $R^1SiO_{3/2}$ (T Unit): 40 to 99 mol %, (II) siloxane unit shown by $R^2R^3SiO_{2/2}$ (D Unit): 59 mol % or less, and (III) siloxane unit shown by $R^4R^5R^6SiO_{1/2}$ (M Unit): 1 to 30 mol %, wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

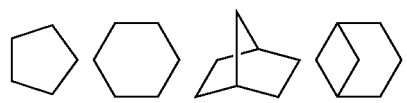

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms;

the hydrosilyl-containing organopolysiloxane (A3) containing 2 to 20 mol % of hydrogen atoms relative to totality of the organic groups and hydrogen atoms shown by the foregoing $R^1$ to $R^6$, and an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2), $$R^9{}_dR^{10}{}_eR^{11}{}_fSiO_{(4-d-e-f)/2} \quad (2)$$

wherein $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy 0<d≤2, 0≤e≤1, 0.75≤d+e≤3, 0.01≤f≤1, and 0.8≤d+e+f≤4, in the presence of a platinum group metal-based catalyst.

8. The wafer process body according to claim 2, wherein the non-aromatic saturated hydrocarbon group-containing organopolysiloxane layers (A) and (A') are an organopolysiloxane layer which is obtained by a hydrosilylation reaction between a hydrosilyl-containing organopolysiloxane (A3) which are a non-aromatic saturated hydrocarbon group-containing organopolysiloxanes which contain units shown by the following formulae (I) to (III):

(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %, wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms;

the hydrosilyl-containing organopolysiloxane (A3) containing 2 to 20 mol % of hydrogen atoms relative to totality of the organic groups and hydrogen atoms shown by the foregoing $R^1$ to $R^6$, and an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2),

wherein $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy 0<d≤2, 0≤e≤1, 0.75≤d+e≤3, 0.01≤f≤1, and 0.8≤d+e+f≤4, in the presence of a platinum group metal-based catalyst.

9. The wafer process body according to claim 5, wherein the hydrosilyl-containing compound (A2) is an organohydrogen polysiloxane which has SiH groups at the both terminals and is shown by the following structural formula (3) or a bissilyl compound which has the SiH groups at the both terminals and is shown by the following structural formula (4),

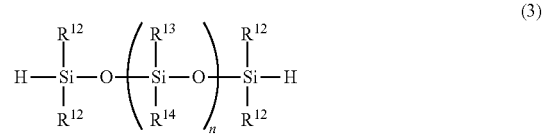

wherein "n" represents a positive number of 0 to 400; $R^{12}$ to $R^{14}$ represent the same or different substituted or unsubstituted monovalent organic group,

wherein $R^{15}$ to $R^{17}$ represent the same or different substituted or unsubstituted monovalent organic group; and W represents a divalent organic group.

10. The wafer process body according to claim 6, wherein the hydrosilyl-containing compound (A2) is an organohydrogen polysiloxane which has SiH groups at the both terminals and is shown by the following structural formula (3) or a bissilyl compound which has the SiH groups at the both terminals and is shown by the following structural formula (4),

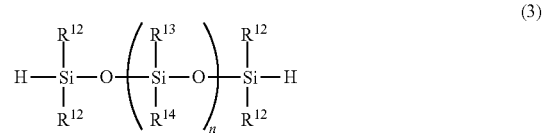

wherein "n" represents a positive number of 0 to 400; $R^{12}$ to $R^{14}$ represent the same or different substituted or unsubstituted monovalent organic group,

wherein $R^{15}$ to $R^{17}$ represent the same or different substituted or unsubstituted monovalent organic group; and W represents a divalent organic group.

11. The wafer process body according to claim 1, wherein the thermosetting-modified siloxane polymer layer (B) is a cured layer of a composition containing 0.1 to 50 parts by mass of one or more kinds of crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule, relative to 100 parts by mass of a thermosetting-modified siloxane polymer composed of a silphenylene-containing polymer having a repeating unit shown by the following general formula (5) with the weight-average molecular weight of 3,000 to 500,000 or an epoxy group-containing silicone polymer having a repeating unit shown by the following general formula (6) with the weight-average molecular weight of 3,000 to 500,000,

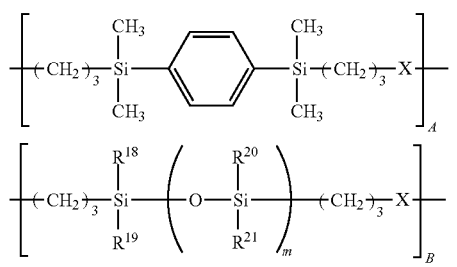

(5)

wherein $R^{18}$ to $R^{21}$ represent the same or different monovalent hydrocarbon group having 1 to 8 carbon atoms; "m" represents an integer of 1 to 100; A represents a positive number and B represents 0 or a positive number; X represents a divalent organic group shown by the following general formula (7),

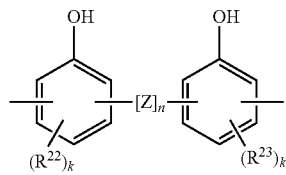

(7)

wherein Z represents a divalent organic group selected from any of

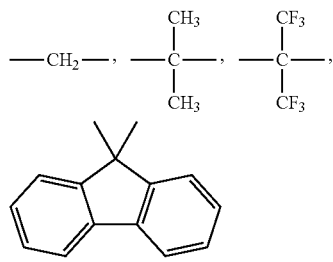

wherein, "n" represents 0 or 1; each of $R^{22}$ and $R^{23}$ represents the same or different alkyl or alkoxy group having 1 to 4 carbon atoms; "k" represents any of 0, 1, and 2,

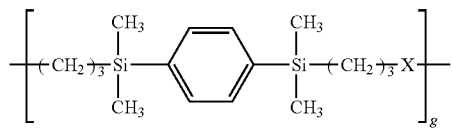

(6)

-continued

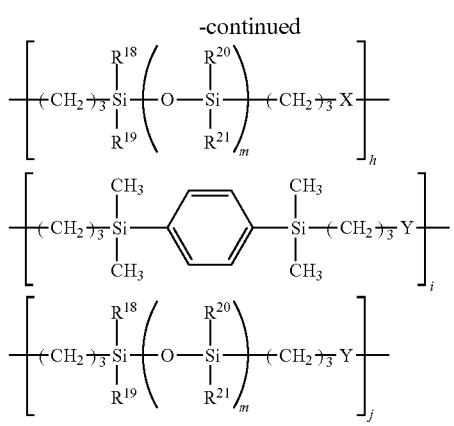

wherein $R^{18}$ to $R^{21}$ represent the same or different monovalent hydrocarbon group having 1 to 8 carbon atoms; "m" represents an integer of 1 to 100; "g", "h", "i", and "j" represent 0 or a positive number which satisfies $0<(i+j)/(g+h+i+j)\leq 1.0$, and "i" and "j" are not 0 at the same time; X represents a divalent organic group shown by the following general formula (7); and Y represents a divalent organic group shown by the following general formula (8),

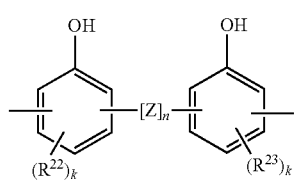

(7)

wherein Z represents a divalent organic group selected from any of

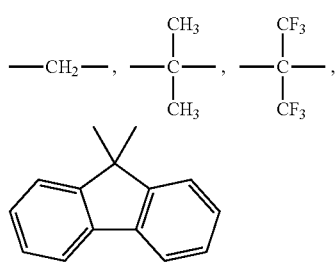

wherein, "n" represents 0 or 1; each of $R^{22}$ and $R^{23}$ represents the same or different alkyl or alkoxy group having 1 to 4 carbon atoms; "k" represents any of 0, 1, and 2,

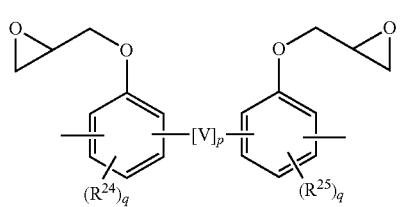

(8)

wherein V represents a divalent organic group selected from any of

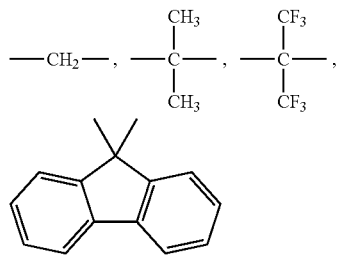

wherein, "p" represents 0 or 1; each of $R^{24}$ and $R^{25}$ represents the same or different alkyl or alkoxy group having 1 to 4 carbon atoms; and "q" represents any of 0, 1, and 2.

12. The wafer process body according to claim 2, wherein the thermosetting-modified siloxane polymer layer (B) is a cured layer of a composition containing 0.1 to 50 parts by mass of one or more kinds of crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule, relative to 100 parts by mass of a thermosetting-modified siloxane polymer composed of a silphenylene-containing polymer having a repeating unit shown by the following general formula (5) with the weight-average molecular weight of 3,000 to 500,000 or an epoxy group-containing silicone polymer having a repeating unit shown by the following general formula (6) with the weight-average molecular weight of 3,000 to 500,000,

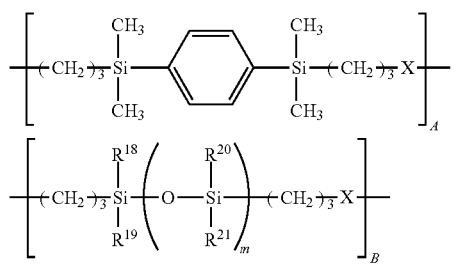

(5)

wherein $R^{18}$ to $R^{21}$ represent the same or different monovalent hydrocarbon group having 1 to 8 carbon atoms; "m" represents an integer of 1 to 100; A represents a positive number and B represents 0 or a positive number; X represents a divalent organic group shown by the following general formula (7),

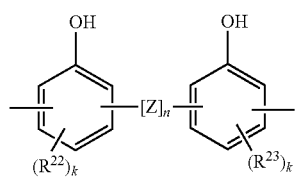

(7)

wherein Z represents a divalent organic group selected from any of

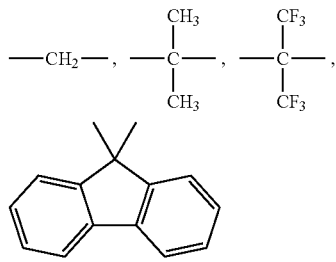

wherein, "n" represents 0 or 1; each of $R^{22}$ and $R^{23}$ represents the same or different alkyl or alkoxy group having 1 to 4 carbon atoms; "k" represents any of 0, 1, and 2,

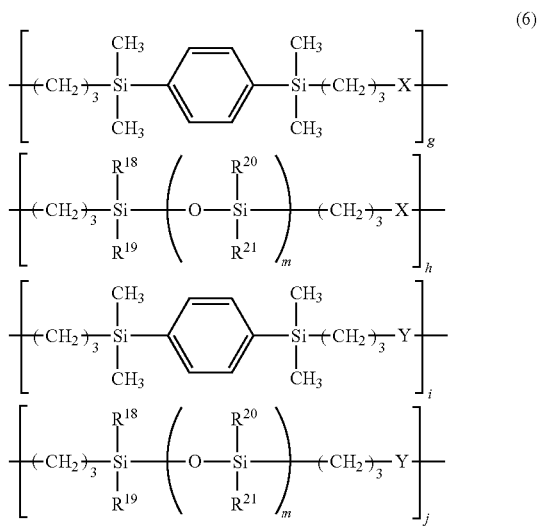

(6)

wherein $R^{18}$ to $R^{21}$ represent the same or different monovalent hydrocarbon group having 1 to 8 carbon atoms; "m" represents an integer of 1 to 100; "g", "h", "i", and "j" represent 0 or a positive number which satisfies $0<(i+j)/(g+h+i+j)\leq 1.0$, and "i" and "j" are not 0 at the same time; X represents a divalent organic group shown by the following general formula (7); and Y represents a divalent organic group shown by the following general formula (8),

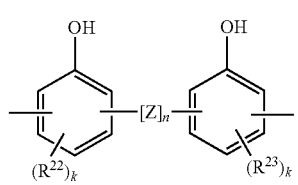

(7)

wherein Z represents a divalent organic group selected from any of

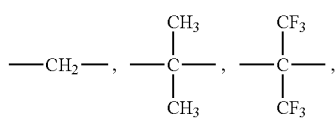

-continued

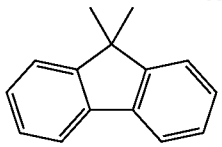

wherein, "n" represents 0 or 1; each of $R^{22}$ and $R^{23}$ represents the same or different alkyl or alkoxy group having 1 to 4 carbon atoms; "k" represents any of 0, 1, and 2,

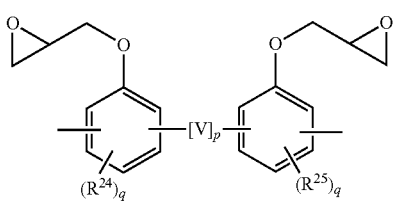
(8)

wherein V represents a divalent organic group selected from any of

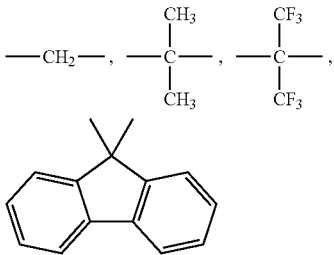

wherein, "p" represents 0 or 1; each of $R^{24}$ and $R^{25}$ represents the same or different alkyl or alkoxy group having 1 to 4 carbon atoms; and "q" represents any of 0, 1, and 2.

13. A method for manufacturing a thin wafer comprising:
(a) a step of grinding or polishing of the non-circuit-formed surface of the wafer in a wafer process body, wherein, in the wafer process body, a temporary adhesive layer is formed on a supporting body, and a wafer having a circuit-formed front surface and a to-be-processed back surface is stacked on the temporary adhesive layer, wherein the temporary adhesive layer is formed by:
    forming a first temporary adhesive layer composed of a non-aromatic saturated hydrocarbon group-containing organopolysiloxane layer (A) which is adhered to the front surface of the wafer so as to be detachable, and
    forming a second temporary adhesive layer composed of a thermosetting-modified siloxane polymer layer (B) which is stacked on the first temporary adhesive layer and adhered to the supporting body so as to be detachable,
(b) a step of processing of the non-circuit-formed surface of the wafer, and
(c) a step of detaching the processed wafer from the supporting body.

14. A method for manufacturing a thin wafer comprising:
(a) a step of grinding or polishing of the non-circuit-formed surface of the wafer in a wafer process body, wherein, in the wafer process body, a temporary adhesive layer is formed on a supporting body and a wafer having a circuit-formed front surface and a to-be-processed back surface is stacked on the temporary adhesive layer, wherein the temporary adhesive layer is a composite temporary adhesive layer having a three-layered structure formed by:
    forming a first temporary adhesive layer composed of a non-aromatic saturated hydrocarbon group-containing organopolysiloxane layer (A) which is adhered to the front surface of the wafer so as to be detachable,
    forming a second temporary adhesive layer composed of a thermosetting-modified siloxane polymer layer (B) which is stacked on the first temporary adhesive layer, and
    forming a third temporary adhesive layer composed of a non-aromatic saturated hydrocarbon group-containing organopolysiloxane layer (A') which is similar to the first temporary adhesive layer; the layer (A') being stacked on the second temporary adhesive layer and adhered to the supporting body so as to be detachable,
(b) a step of processing of the non-circuit-formed surface of the wafer, and
(c) a step of detaching the processed wafer from the supporting body.

15. The method for manufacturing a thin wafer according to claim 13, wherein detachment of the processed wafer from the supporting body in the step (c) is done by a method wherein, after a dicing tape is adhered on the processed surface of the processed wafer, surface of the dicing tape is vacuum-adhered onto a suction surface, and then, the supporting body is detached by peeling-off from the processed wafer with the temperature of the suction surface being in the range of 10 to 100° C.

16. The method for manufacturing a thin wafer according to claim 14, wherein detachment of the processed wafer from the supporting body in the step (c) is done by a method wherein, after a dicing tape is adhered on the processed surface of the processed wafer, surface of the dicing tape is vacuum-adhered onto a suction surface, and then, the supporting body is detached by peeling-off from the processed wafer with the temperature of the suction surface being in the range of 10 to 100° C.

17. The method for manufacturing a thin wafer according to claim 13, wherein, after detachment of the processed wafer from the supporting body in the step (c), (d) a step of removing the non-aromatic saturated hydrocarbon group-containing organopolysiloxane layer (A) which is remained on the circuit-formed surface of the detached wafer is carried out.

18. The method for manufacturing a thin wafer according to claim 14, wherein, after detachment of the processed wafer from the supporting body in the step (c), (d) a step of removing the non-aromatic saturated hydrocarbon group-containing organopolysiloxane layer (A) which is remained on the circuit-formed surface of the detached wafer is carried out.

19. The method for manufacturing a thin wafer according to claim 15, wherein, after detachment of the processed wafer from the supporting body in the step (c), (d) a step of removing the non-aromatic saturated hydrocarbon group-containing organopolysiloxane layer (A) which is remained on the circuit-formed surface of the detached wafer is carried out.

20. The method for manufacturing a thin wafer according to claim 16, wherein, after detachment of the processed wafer from the supporting body in the step (c), (d) a step of removing the non-aromatic saturated hydrocarbon group-containing organopolysiloxane layer (A) which is remained on the circuit-formed surface of the detached wafer is carried out.

21. A wafer processing member, wherein, in the wafer processing member, a temporary adhesive layer is formed on a supporting body, and a wafer having a circuit-formed front surface and a to-be-processed back surface is to be temporarily adhered to the temporary adhesive layer, wherein the temporary adhesive layer comprises:
a second temporary adhesive layer composed of a thermosetting-modified siloxane polymer layer (B) which is adhered to the supporting body so as to be detachable and
a first temporary adhesive layer composed of a non-aromatic saturated hydrocarbon group-containing organopolysiloxane layer (A) which is stacked on the second adhesive layer; the layer (A) being capable of adhesion to and detachment from the front surface of the wafer.

22. A wafer processing member, wherein, in the wafer processing member, a temporary adhesive layer is formed on a supporting body, and a wafer having a circuit-formed front surface and a to-be-processed back surface is to be temporarily adhered to the temporary adhesive layer, wherein the temporary adhesive layer comprises:
a third temporary adhesive layer composed of a non-aromatic saturated hydrocarbon group-containing organopolysiloxane layer (A') which is adhered to the supporting body so as to be detachable,
a second temporary adhesive layer composed of a thermosetting-modified siloxane polymer layer (B) which is stacked on the third temporary adhesive layer, and
a first temporary adhesive layer composed of a non-aromatic saturated hydrocarbon group-containing organopolysiloxane layer (A) which is similar to the third temporary adhesive layer and is stacked on the second adhesive layer; the layer (A) being capable of adhesion to and detachment from the front surface of the wafer.

23. The wafer processing member according to claim 21, wherein the non-aromatic saturated hydrocarbon group-containing organopolysiloxane layers (A) and (A') are a non-aromatic saturated hydrocarbon group-containing organopolysiloxane layer which contains the units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

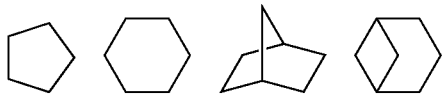

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms.

24. The wafer processing member according to claim 22, wherein the non-aromatic saturated hydrocarbon group-containing organopolysiloxane layers (A) and (A') are a non-aromatic saturated hydrocarbon group-containing organopolysiloxane layer which contains the units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

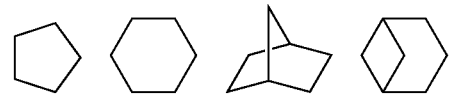

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms.

25. The wafer processing member according to claim 21, wherein, the non-aromatic saturated hydrocarbon group-containing organopolysiloxane layers (A) and (A') are an organopolysiloxane layer which is obtained by a hydrosilylation reaction between an alkenly-containing organopolysiloxane (A1) which are a non-aromatic saturated hydrocarbon group-containing organopolysiloxanes which contain units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the alkenly-containing organopolysiloxane (A1) containing 2 to 30 mol % of an alkenyl group having 2 to 7 carbon atoms relative to totality of the organic groups and hydrogen atoms shown by the foregoing $R^1$ to $R^6$, and a hydrosilyl-containing compound (A2) with the amount thereof being 0.4 to 1.0-fold of the total SiH group relative to the total alkenyl group of the alkenyl-containing organopolysiloxane (A1), wherein the hydrosilyl-containing compound contains at least two SiH groups per one molecule and is shown by the following average composition formula (1), $$R^7_a R^8_b H_c SiO_{(4-a-b-c)/2} \quad (1)$$

wherein $R^7$ represents a monovalent organic group other than an alkenyl group; $R^8$ represents a divalent organic group; and "a", "b", and "c" represent positive numbers which satisfy $0<a\leq2.5$, $0\leq b\leq1$, $0.75\leq a+b\leq2.5$, $0.005\leq c\leq1$, and $0.8\leq a+b+c\leq4$, in the presence of a platinum group metal-based catalyst.

26. The wafer processing member according to claim 22, wherein, the non-aromatic saturated hydrocarbon group-containing organopolysiloxane layers (A) and (A') are an organopolysiloxane layer which is obtained by a hydrosilylation reaction between an alkenly-containing organopolysiloxane (A1) which are a non-aromatic saturated hydrocarbon group-containing organopolysiloxanes which contain units shown by the following formulae (I) to (III):

(I) siloxane unit shown by $R^1SiO_{3/2}$ (T Unit): 40 to 99 mol %, (II) siloxane unit shown by $R^2R^3SiO_{2/2}$ (D Unit): 59 mol % or less, and (III) siloxane unit shown by $R^4R^5R^6SiO_{1/2}$ (M Unit): 1 to 30 mol %, wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the alkenly-containing organopolysiloxane (A1) containing 2 to 30 mol % of an alkenyl group having 2 to 7 carbon atoms relative to totality of the organic groups and hydrogen atoms shown by the foregoing $R^1$ to $R^6$, and a hydrosilyl-containing compound (A2) with the amount thereof being 0.4 to 1.0-fold of the total SiH group relative to the total alkenyl group of the alkenyl-containing organopolysiloxane (A1), wherein the hydrosilyl-containing compound contains at least two SiH groups per one molecule and is shown by the following average composition formula (1), $$R^7_a R^8_b H_c SiO_{(4-a-b-c)/2} \quad (1)$$

wherein $R^7$ represents a monovalent organic group other than an alkenyl group; $R^8$ represents a divalent organic group; and "a", "b", and "c" represent positive numbers which satisfy $0<a\leq2.5$, $0\leq b\leq1$, $0.75\leq a+b\leq2.5$, $0.005\leq c\leq1$, and $0.8\leq a+b+c\leq4$, in the presence of a platinum group metal-based catalyst.

27. The wafer processing member according to claim 21, wherein, the non-aromatic saturated hydrocarbon group-containing organopolysiloxane layers (A) and (A') are an organopolysiloxane layer which is obtained by a hydrosilylation reaction between a hydrosilyl-containing organopolysiloxane (A3) which are a non-aromatic saturated hydrocarbon group-containing organopolysiloxanes which contain units shown by the following formulae (I) to (III):

(I) siloxane unit shown by $R^1SiO_{3/2}$ (T Unit): 40 to 99 mol %, (II) siloxane unit shown by $R^2R^3SiO_{2/2}$ (D Unit): 59 mol % or less, and (III) siloxane unit shown by $R^4R^5R^6SiO_{1/2}$ (M Unit): 1 to 30 mol %, wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the hydrosilyl-containing organopolysiloxane (A3) containing 2 to 20 mol % of hydrogen atoms relative to totality of the organic groups and hydrogen atoms shown by the foregoing $R^1$ to $R^6$, and an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2),

$$R^9_d R^{10}_e R^{11}_f SiO_{(4-d-e-f)/2} \quad (2)$$

wherein $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy $0<d\le2$, $0\le e\le1$, $0.75\le d+e\le3$, $0.01\le f\le1$, and $0.8\le d+e+f\le4$, in the presence of a platinum group metal-based catalyst.

28. The wafer processing member according to claim 22, wherein, the non-aromatic saturated hydrocarbon group-containing organopolysiloxane layers (A) and (A') are an organopolysiloxane layer which is obtained by a hydrosilylation reaction between a hydrosilyl-containing organopolysiloxane (A3) which are a non-aromatic saturated hydrocarbon group-containing organopolysiloxanes which contain units shown by the following formulae (I) to (III):

(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %, wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

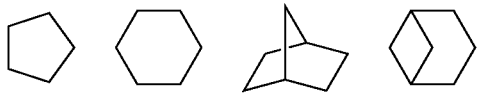

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the hydrosilyl-containing organopolysiloxane (A3) containing 2 to 20 mol % of hydrogen atoms relative to totality of the organic groups and hydrogen atoms shown by the foregoing $R^1$ to $R^6$, and an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2), $$R^9_d R^{10}_e R^{11}_f SiO_{(4-d-e-f)/2} \quad (2)$$

wherein $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy $0\le d\le2$, $0\le e\le1$, $0.75\le d+e\le3$, $0.01\le f\le1$, and $0.8\le d+e+f\le4$, in the presence of a platinum group metal-based catalyst.

29. The wafer processing member according to claim 25, wherein the hydrosilyl-containing compound (A2) is an organohydrogen polysiloxane which has SiH groups at the both terminals and is shown by the following structural formula (3) or a bissilyl compound which has the SiH groups at the both terminals and is shown by the following structural formula (4),

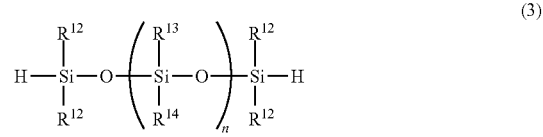

wherein "n" represents a positive number of 0 to 400; $R^{12}$ to $R^{14}$ represent the same or different substituted or unsubstituted monovalent organic group,

wherein $R^{15}$ to $R^{17}$ represent the same or different substituted or unsubstituted monovalent organic group; and W represents a divalent organic group.

30. The wafer processing member according to claim 26, wherein the hydrosilyl-containing compound (A2) is an organohydrogen polysiloxane which has SiH groups at the both terminals and is shown by the following structural formula (3) or a bissilyl compound which has the SiH groups at the both terminals and is shown by the following structural formula (4),

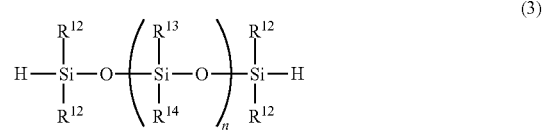

wherein "n" represents a positive number of 0 to 400; $R^{12}$ to $R^{14}$ represent the same or different substituted or unsubstituted monovalent organic group,

wherein $R^{15}$ to $R^{17}$ represent the same or different substituted or unsubstituted monovalent organic group; and W represents a divalent organic group.

31. The wafer processing member according to claim 21, wherein the polymer layer (B) is a cured layer of a composition containing 0.1 to 50 parts by mass of one or more kinds of crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule, relative to 100 parts by mass of a thermosetting-modified siloxane polymer composed of a silphenylene-containing polymer having a repeating unit shown by the following general formula (5) with the weight-average molecular weight of 3,000 to 500,000 or an epoxy group-containing silicone polymer having a repeating unit shown by the following general formula (6) with the weight-average molecular weight of 3,000 to 500,000, (5)

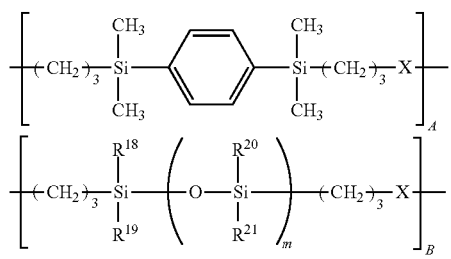

wherein $R^{18}$ to $R^{21}$ represent the same or different monovalent hydrocarbon group having 1 to 8 carbon atoms; "m" represents an integer of 1 to 100; A represents a positive number and B represents 0 or a positive number; X represents a divalent organic group shown by the following general formula (7), (7)

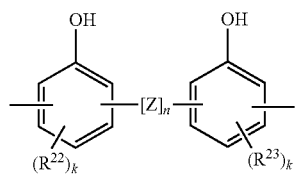

wherein Z represents a divalent organic group selected from any of

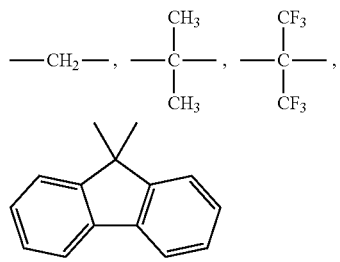

wherein, "n" represents 0 or 1; each of $R^{22}$ and $R^{23}$ represents the same or different alkyl or alkoxy group having 1 to 4 carbon atoms; "k" represents any of 0, 1, and 2, (6)

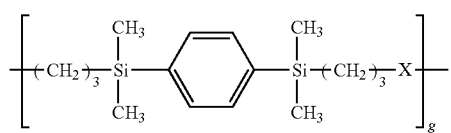

-continued

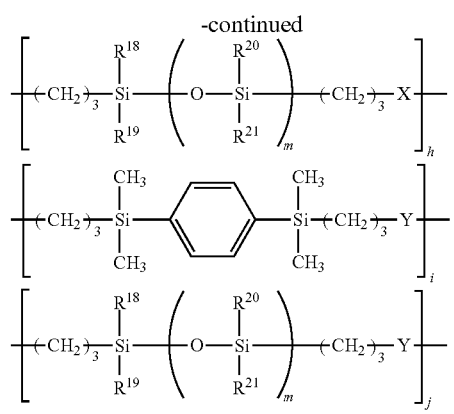

wherein $R^{18}$ to $R^{21}$ represent the same or different monovalent hydrocarbon group having 1 to 8 carbon atoms; "m" represents an integer of 1 to 100; "g", "h", "i", and "j" represent 0 or a positive number which satisfies 0<(i+j)/(g+h+i+j)≤1.0, and "i" and "j" are not 0 at the same time; X represents a divalent organic group shown by the following general formula (7); Y represents a divalent organic group shown by the following general formula (8), (7)

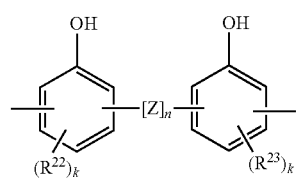

wherein Z represents a divalent organic group selected from any of

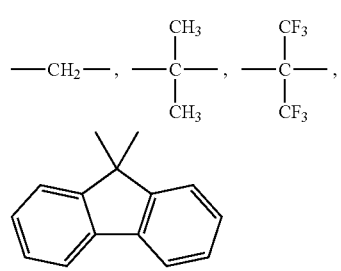

wherein, "n" represents 0 or 1; each of $R^{22}$ and $R^{23}$ represents the same or different alkyl or alkoxy group having 1 to 4 carbon atoms; "k" represents any of 0, 1, and 2, (8)

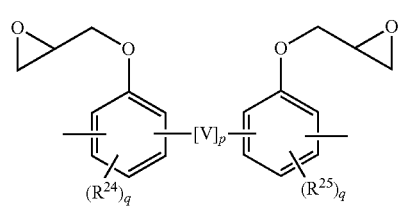

wherein V represents a divalent organic group selected from any of

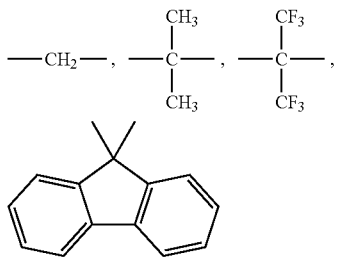

wherein, "p" represents 0 or 1; each of $R^{24}$ and $R^{25}$ represents the same or different alkyl or alkoxy group having 1 to 4 carbon atoms; and "q" represents any of 0, 1, and 2.

32. The wafer processing member according to claim 22, wherein the polymer layer (B) is a cured layer of a composition containing 0.1 to 50 parts by mass of one or more kinds of crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule, relative to 100 parts by mass of a thermosetting-modified siloxane polymer composed of a silphenylene-containing polymer having a repeating unit shown by the following general formula (5) with the weight-average molecular weight of 3,000 to 500,000 or an epoxy group-containing silicone polymer having a repeating unit shown by the following general formula (6) with the weight-average molecular weight of 3,000 to 500,000,

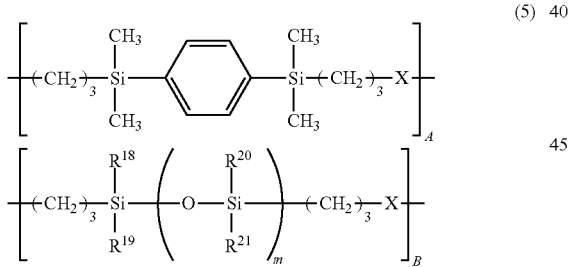

(5)

wherein $R^{18}$ to $R^{21}$ represent the same or different monovalent hydrocarbon group having 1 to 8 carbon atoms; "m" represents an integer of 1 to 100; A represents a positive number and B represents 0 or a positive number; X represents a divalent organic group shown by the following general formula (7),

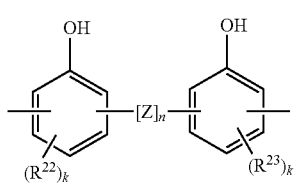

(7)

wherein Z represents a divalent organic group selected from any of

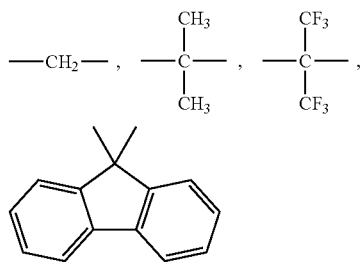

wherein, "n" represents 0 or 1; each of $R^{22}$ and $R^{23}$ represents the same or different alkyl or alkoxy group having 1 to 4 carbon atoms; "k" represents any of 0, 1, and 2,

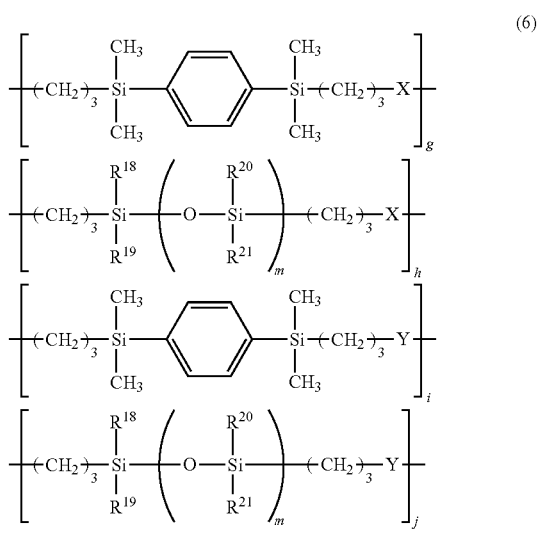

(6)

wherein $R^{18}$ to $R^{21}$ represent the same or different monovalent hydrocarbon group having 1 to 8 carbon atoms; "m" represents an integer of 1 to 100; "g", "h", "i", and "j" represent 0 or a positive number which satisfies 0<(i+j)/(g+h+i+j)≤1.0, and "i" and "j" are not 0 at the same time; X represents a divalent organic group shown by the following general formula (7); Y represents a divalent organic group shown by the following general formula (8),

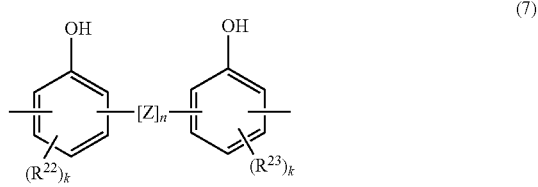

(7)

wherein Z represents a divalent organic group selected from any of

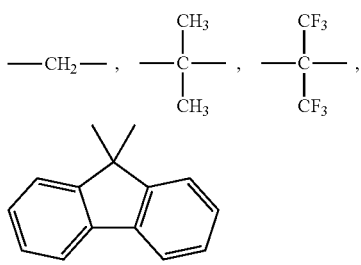

wherein, "n" represents 0 or 1; each of $R^{22}$ and $R^{23}$ represents the same or different alkyl or alkoxy group having 1 to 4 carbon atoms; "k" represents any of 0, 1, and 2,

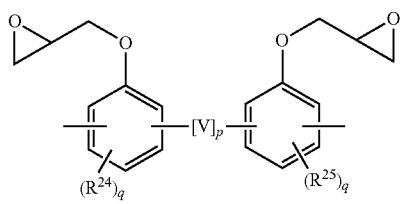

(8)

wherein V represents a divalent organic group selected from any of

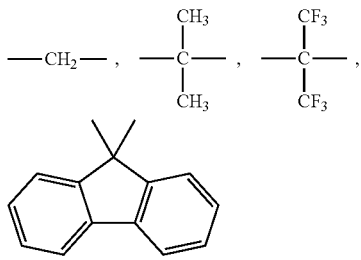

wherein, "p" represents 0 or 1; each of $R^{24}$ and $R^{25}$ represents the same or different alkyl or alkoxy group having 1 to 4 carbon atoms; and "q" represents any of 0, 1, and 2.

33. A wafer processing temporary adhesive material, wherein the wafer processing temporary adhesive material is to temporarily bond a supporting body to a wafer which has a circuit formed front surface and a to-be-processed back surface, wherein the wafer processing temporary adhesive material comprises
a first temporary adhesive layer composed of a non-aromatic saturated hydrocarbon group-containing organopolysiloxane layer (A) which is capable of adhesion to and detachment from the front surface of the wafer and
a second temporary adhesive layer composed of a thermosetting-modified siloxane polymer layer (B) which is stacked on the first temporary adhesive layer; the layer (B) being capable of adhesion to and detachment from the supporting body.

34. A wafer processing temporary adhesive material, wherein the wafer processing temporary adhesive material is to temporarily bond a supporting body to a wafer which has a circuit formed front surface and a to-be-processed back surface, wherein the wafer processing temporary adhesive material comprises:
a first temporary adhesive layer composed of a non-aromatic saturated hydrocarbon group-containing organopolysiloxane layer (A) which is capable of adhesion to and detachment from the front surface of the wafer,
a second temporary adhesive layer composed of a thermosetting-modified siloxane polymer layer (B) which is stacked on the first temporary adhesive layer, and
a third temporary adhesive layer composed of a non-aromatic saturated hydrocarbon group-containing organopolysiloxane layer (A') which is similar to the first temporary adhesive layer and is stacked on the second temporary adhesive layer; the layer (A') being capable of adhesion to and detachment from the supporting body.

35. The wafer processing temporary adhesive material according to claim 33, wherein the non-aromatic saturated hydrocarbon group-containing organopolysiloxane layers (A) and (A') are a non-aromatic saturated hydrocarbon group-containing organopolysiloxane layer which contains the units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms.

36. The wafer processing temporary adhesive material according to claim 34, wherein the non-aromatic saturated hydrocarbon group-containing organopolysiloxane layers (A) and (A') are a non-aromatic saturated hydrocarbon group-containing organopolysiloxane layer which contains the units shown by the following formulae (I) to (III):
(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %,
wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms.

37. The wafer processing temporary adhesive material according to claim 33, wherein the non-aromatic saturated hydrocarbon group-containing organopolysiloxane layers (A) and (A') are an organopolysiloxane layer which is obtained by a hydrosilylation reaction between an alkenly-containing organopolysiloxane (A1) which are a non-aromatic saturated hydrocarbon group-containing organopolysiloxanes which contain the units shown by the following formulae (I) to (III):

(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %, wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the alkenly-containing organopolysiloxane (A1) containing 2 to 30 mol % of an alkenyl group having 2 to 7 carbon atoms relative to totality of the organic groups and hydrogen atoms shown by the foregoing $R^1$ to $R^6$ and a hydrosilyl-containing compound (A2) with the amount thereof being 0.4 to 1.0-fold of the total SiH group relative to the total alkenyl group of the alkenyl-containing organopolysiloxane (A1), wherein the hydrosilyl-containing compound contains at least two SiH groups per one molecule and is shown by the following average composition formula (1),

wherein $R^7$ represents a monovalent organic group other than an alkenyl group; $R^8$ represents a divalent organic group; and "a", "b", and "c" represent positive numbers which satisfy $0<a\leq2.5$, $0\leq b\leq1$, $0.75\leq a+b\leq2.5$, $0.005\leq c\leq1$, and $0.8\leq a+b+c\leq4$, in the presence of a platinum group metal-based catalyst.

38. The wafer processing temporary adhesive material according to claim 34, wherein the non-aromatic saturated hydrocarbon group-containing organopolysiloxane layers (A) and (A') are an organopolysiloxane layer which is obtained by a hydrosilylation reaction between an alkenly-containing organopolysiloxane (A1) which are a non-aromatic saturated hydrocarbon group-containing organopolysiloxanes which contain the units shown by the following formulae (I) to (III):

(I) siloxane unit shown by $R^1SiO_{3/2}$ (T Unit): 40 to 99 mol %,
(II) siloxane unit shown by $R^2R^3SiO_{2/2}$ (D Unit): 59 mol % or less, and
(III) siloxane unit shown by $R^4R^5R^6SiO_{1/2}$ (M Unit): 1 to 30 mol %, wherein, $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

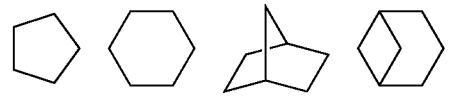

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the alkenly-containing organopolysiloxane (A1) containing 2 to 30 mol % of an alkenyl group having 2 to 7 carbon atoms relative to totality of the organic groups and hydrogen atoms shown by the foregoing $R^1$ to $R^6$ and a hydrosilyl-containing compound (A2) with the amount thereof being 0.4 to 1.0-fold of the total SiH group relative to the total alkenyl group of the alkenyl-containing organopolysiloxane (A1), wherein the hydrosilyl-containing compound contains at least two SiH groups per one molecule and is shown by the following average composition formula (1),

wherein $R^7$ represents a monovalent organic group other than an alkenyl group; $R^8$ represents a divalent organic group; and "a", "b", and "c" represent positive numbers which satisfy $0<a\leq 2.5$, $0\leq b\leq 1$, $0.75\leq a+b\leq 2.5$, $0.005\leq c\leq 1$, and $0.8\leq a+b+c\leq 4$, in the presence of a platinum group metal-based catalyst.

39. The wafer processing temporary adhesive material according to claim 33, wherein the non-aromatic saturated hydrocarbon group-containing organopolysiloxane layers (A) and (A') are an organopolysiloxane layer which is obtained by a hydrosilylation reaction between a hydrosilyl-containing organopolysiloxane (A3) which are a non-aromatic saturated hydrocarbon group-containing organopolysiloxanes which contain units shown by the following formulae (I) to (III):

(I) siloxane unit shown by $R^1SiO_{3/2}$ (T Unit): 40 to 99 mol %, (II) siloxane unit shown by $R^2R^3SiO_{2/2}$ (D Unit): 59 mol % or less, and (III) siloxane unit shown by $R^4R^5R^6SiO_{1/2}$ (M Unit): 1 to 30 mol %, wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the hydrosilyl-containing organopolysiloxane (A3) containing 2 to 20 mol % of hydrogen atoms relative to totality of the organic groups and hydrogen atoms shown by the foregoing $R^1$ to $R^6$ and an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2),

wherein $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy $0<d\leq 2$, $0\leq e\leq 1$, $0.75\leq d+e\leq 3$, $0.01\leq f\leq 1$, and $0.8\leq d+e+f\leq 4$, in the presence of a platinum group metal-based catalyst.

40. The wafer processing temporary adhesive material according to claim 34, wherein the non-aromatic saturated hydrocarbon group-containing organopolysiloxane layers (A) and (A') are an organopolysiloxane layer which is obtained by a hydrosilylation reaction between a hydrosilyl-containing organopolysiloxane (A3) which are a non-aromatic saturated hydrocarbon group-containing organopolysiloxanes which contain units shown by the following formulae (I) to (III):

(I) siloxane unit shown by $R^1SiO_{3/2}$ (T Unit): 40 to 99 mol %, (II) siloxane unit shown by $R^2R^3SiO_{2/2}$ (D Unit): 59 mol % or less, and (III) siloxane unit shown by $R^4R^5R^6SiO_{1/2}$ (M Unit): 1 to 30 mol %, wherein $R^1$ to $R^6$ represent a monovalent organic group or a hydrogen atom; 50 mol % or more of entirety of the organic groups and the hydrogen atoms shown by the foregoing $R^1$ to $R^6$ is a non-aromatic saturated hydrocarbon group having 3 to 20 carbon atoms; 40 mol % or more of entirety of the organic groups and the hydrogen atoms shown by the foregoing $R^1$ to $R^3$ is the same or different non-aromatic saturated hydrocarbon group containing the following cyclic structures having 5 to 7 carbon atoms;

and a group other than a non-aromatic saturated hydrocarbon group in the entirety of the organic groups and the hydrogen atoms shown by the foregoing $R^1$ to $R^6$ is a hydrogen atom or the same or different substituted or unsubstituted monovalent hydrocarbon group having 1 to 7 carbon atoms, the hydrosilyl-containing organopolysiloxane (A3) containing 2 to 20 mol % of hydrogen atoms relative to totality of the organic groups and hydrogen atoms shown by the foregoing $R^1$ to $R^6$ and an alkenyl-containing compound (A4) with the amount thereof being 1.0 to 2.5-folds of the total alkenyl group relative to the total SiH group of the hydrosilyl-containing organopolysiloxane (A3), wherein the alkenyl-containing compound contains at least two alkenyl groups per one molecule and is shown by the following average composition formula (2),

wherein $R^9$ represents a monovalent organic group other than an alkenyl group; $R^{10}$ represents a divalent organic group; $R^{11}$ represents an alkenyl group having 2 to 6 carbon atoms; and "d", "e", and "f" represent positive numbers which satisfy $0<d\leq 2$, $0\leq e\leq 1$, $0.75\leq d+e\leq 3$, $0.01\leq f\leq 1$, and $0.8\leq d+e+f\leq 4$, in the presence of a platinum group metal-based catalyst.

41. The wafer processing temporary adhesive material according to claim 37, wherein the hydrosilyl-containing compound (A2) is an organohydrogen polysiloxane which has the SiH groups at the both terminals and is shown by the following structural formula (3) or a bissilyl compound which has SiH groups at the both terminals and is shown by the following structural formula (4),

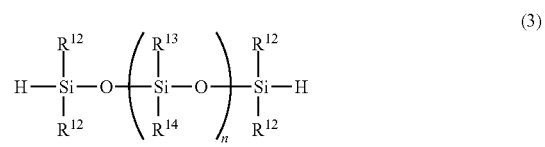

wherein "n" represents a positive number of 0 to 400; and $R^{12}$ to $R^{14}$ represent the same or different substituted or unsubstituted monovalent organic group,

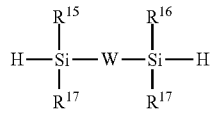
(4)

wherein $R^{15}$ to $R^{17}$ represent the same or different substituted or unsubstituted monovalent organic group; and W represents a divalent organic group.

42. The wafer processing temporary adhesive material according to claim 38, wherein the hydrosilyl-containing compound (A2) is an organohydrogen polysiloxane which has the SiH groups at the both terminals and is shown by the following structural formula (3) or a bissilyl compound which has SiH groups at the both terminals and is shown by the following structural formula (4),

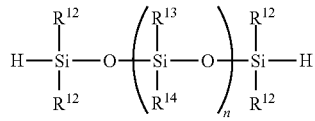
(3)

wherein "n" represents a positive number of 0 to 400; and $R^{12}$ to $R^{14}$ represent the same or different substituted or unsubstituted monovalent organic group,

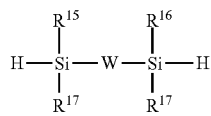
(4)

wherein $R^{15}$ to $R^{17}$ represent the same or different substituted or unsubstituted monovalent organic group; and W represents a divalent organic group.

43. The wafer processing temporary adhesive material according to claim 33, wherein the polymer layer (B) is a cured layer of a composition containing 0.1 to 50 parts by mass of one or more crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule, relative to 100 parts by mass of a thermosetting-modified siloxane polymer composed of a silphenylene-containing polymer having a repeating unit shown by the following general formula (5) with the weight-average molecular weight of 3,000 to 500,000 or an epoxy group-containing silicone polymer having a repeating unit shown by the following general formula (6) with the weight-average molecular weight of 3,000 to 500,000,

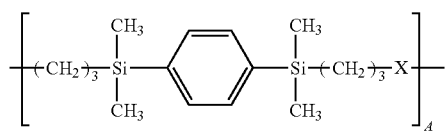
(5)

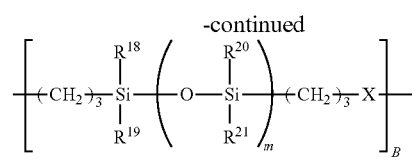

wherein $R^{18}$ to $R^{21}$ represent the same or different monovalent hydrocarbon group having 1 to 8 carbon atoms; "m" represents an integer of 1 to 100; A represents a positive number and B represents 0 or a positive number; X represents a divalent organic group shown by the following general formula (7),

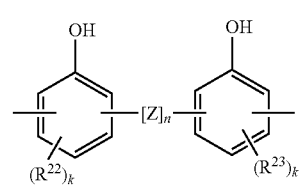
(7)

wherein Z represents a divalent organic group selected from any of

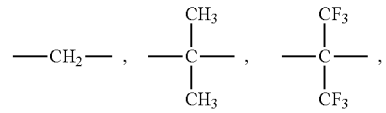

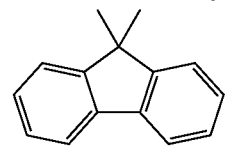

wherein, "n" represents 0 or 1; each of $R^{22}$ and $R^{23}$ represents the same or different alkyl or alkoxy group having 1 to 4 carbon atoms; "k" represents any of 0, 1, and 2,

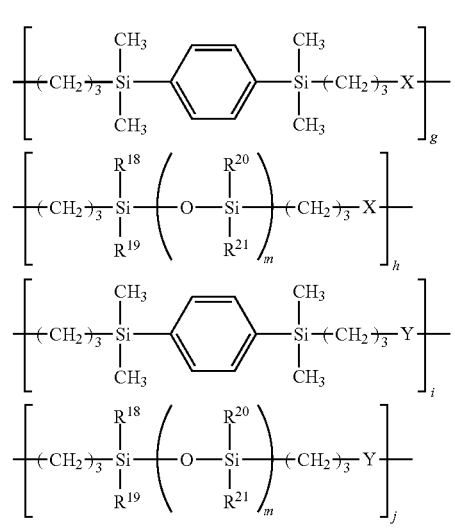
(6)

wherein $R^{18}$ to $R^{21}$ represent the same or different monovalent hydrocarbon group having 1 to 8 carbon atoms; "m" represents an integer of 1 to 100; "g", "h", "i", and "j" represent 0 or a positive number which satisfies 0<(i+j)/

(g+h+i+j)≤1.0, and "i" and "j" are not 0 at the same time; X represents a divalent organic group shown by the following general formula (7); Y represents a divalent organic group shown by the following general formula (8),

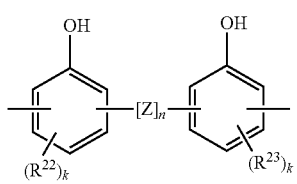
(7)

wherein Z represents a divalent organic group selected from any of

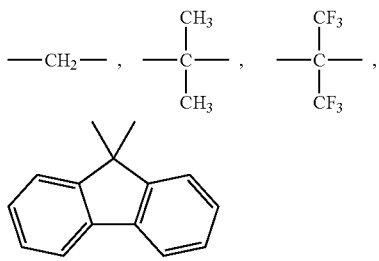

wherein, "n" represents 0 or 1; each of $R^{22}$ and $R^{23}$ represents the same or different alkyl or alkoxy group having 1 to 4 carbon atoms; "k" represents any of 0, 1, and 2,

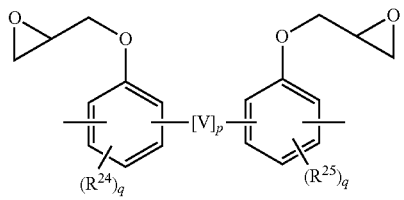
(8)

wherein V represents a divalent organic group selected from any of

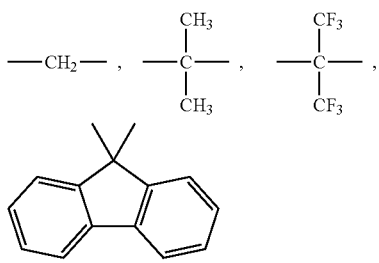

wherein, "p" represents 0 or 1; each of $R^{24}$ and $R^{25}$ represents the same or different alkyl or alkoxy group having 1 to 4 carbon atoms; and "q" represents any of 0, 1, and 2.

44. The wafer processing temporary adhesive material according to claim 34, wherein the polymer layer (B) is a cured layer of a composition containing 0.1 to 50 parts by mass of one or more crosslinking agents selected from the group consisting of an aminocondensate which is modified with formalin or formalin-alcohol, a melamine resin, a urea resin, a phenol compound which contains, as the average, two or more methylol groups or alkoxy methylol groups per one molecule, and an epoxy compound which contains, as the average, two or more epoxy groups per one molecule, relative to 100 parts by mass of a thermosetting-modified siloxane polymer composed of a silphenylene-containing polymer having a repeating unit shown by the following general formula (5) with the weight-average molecular weight of 3,000 to 500,000 or an epoxy group-containing silicone polymer having a repeating unit shown by the following general formula (6) with the weight-average molecular weight of 3,000 to 500,000,

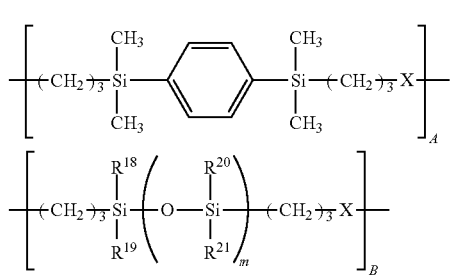
(5)

wherein $R^{18}$ to $R^{21}$ represent the same or different monovalent hydrocarbon group having 1 to 8 carbon atoms; "m" represents an integer of 1 to 100; A represents a positive number and B represents 0 or a positive number; X represents a divalent organic group shown by the following general formula (7),

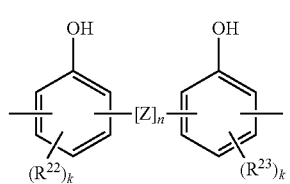
(7)

wherein Z represents a divalent organic group selected from any of

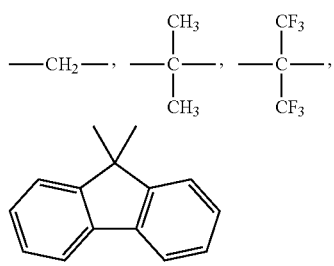

wherein, "n" represents 0 or 1; each of $R^{22}$ and $R^{23}$ represents the same or different alkyl or alkoxy group having 1 to 4 carbon atoms; "k" represents any of 0, 1, and 2,

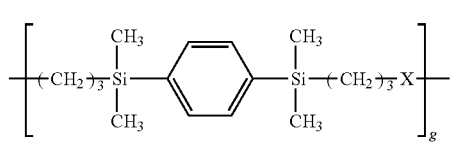
(6)

-continued

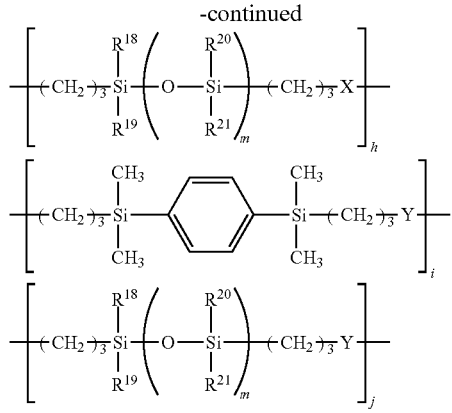

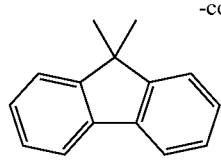

wherein, "n" represents 0 or 1; each of $R^{22}$ and $R^{23}$ represents the same or different alkyl or alkoxy group having 1 to 4 carbon atoms; "k" represents any of 0, 1, and 2, (8)

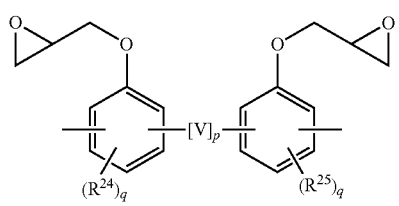

wherein V represents a divalent organic group selected from any of wherein $R^{18}$ to $R^{21}$ represent the same or different monovalent hydrocarbon group having 1 to 8 carbon atoms; "m" represents an integer of 1 to 100; "g", "h", "i", and "j" represent 0 or a positive number which satisfies $0<(i+j)/(g+h+i+j)\leq 1.0$, and "i" and "j" are not 0 at the same time; X represents a divalent organic group shown by the following general formula (7); Y represents a divalent organic group shown by the following general formula (8), (7)

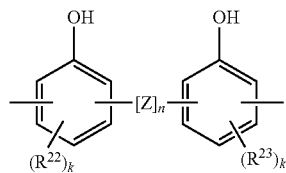

wherein Z represents a divalent organic group selected from any of

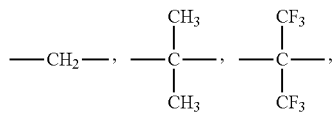

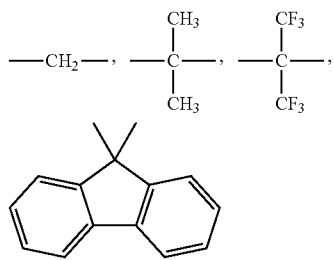

wherein, "p" represents 0 or 1; each of $R^{24}$ and $R^{25}$ represents the same or different alkyl or alkoxy group having 1 to 4 carbon atoms; and "q" represents any of 0, 1, and 2.

\* \* \* \* \*